United States Patent
Yamazaki et al.

(10) Patent No.: US 9,551,063 B2
(45) Date of Patent: Jan. 24, 2017

(54) FABRICATION SYSTEM AND A FABRICATION METHOD OF A LIGHT EMITTING DEVICE

(75) Inventors: Shunpei Yamazaki, Tokyo (JP); Masakazu Murakami, Kanagawa (JP); Hisashi Ohtani, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/272,820

(22) Filed: Nov. 18, 2008

(65) Prior Publication Data
US 2009/0074952 A1 Mar. 19, 2009

Related U.S. Application Data

(63) Continuation of application No. 10/370,577, filed on Feb. 24, 2003, now abandoned.

(30) Foreign Application Priority Data

Feb. 25, 2002 (JP) .................................. 2002-047508

(51) Int. Cl.
*C23C 16/00* (2006.01)
*C23C 14/12* (2006.01)
(Continued)

(52) U.S. Cl.
CPC ............... *C23C 14/12* (2013.01); *C23C 14/24* (2013.01); *C23C 14/505* (2013.01)

(58) Field of Classification Search
CPC .......... B05D 5/12; C23C 14/12; C23C 14/505; C23C 14/243; C23C 14/02
(Continued)

(56) References Cited

U.S. PATENT DOCUMENTS 2,435,997 A 2/1948 Bennett
2,906,637 A 9/1959 Auphan
(Continued)

FOREIGN PATENT DOCUMENTS

CN 1302173 7/2001
DE 28 34 806 2/1980
(Continued)

OTHER PUBLICATIONS

C. W. Tang and S. A. VanSlyke; "Organic electroluminescent diodes"; Applied Physics Letter 51(12), Sep. 21, 1987; pp. 913-915.
(Continued)

*Primary Examiner* — Michael Wieczorek
*Assistant Examiner* — Michael G Miller
(74) *Attorney, Agent, or Firm* — Fish & Richardson P.C.

(57) ABSTRACT

An evaporation apparatus with high utilization efficiency for EL materials and excellent film uniformity is provided. The invention is an evaporation apparatus having a movable evaporation source and a substrate rotating unit, in which the space between an evaporation source holder and a workpiece (substrate) is narrowed to 30 cm or below, preferably 20 cm, more preferably 5 to 15 cm, to improve the utilization efficiency for EL materials. In evaporation, the evaporation source holder is moved in the X-direction or the Y-direction, and the workpiece (substrate) is rotated for deposition. Therefore, film uniformity is improved.

20 Claims, 10 Drawing Sheets

(51) Int. Cl.
*C23C 14/24* (2006.01)
*C23C 14/50* (2006.01)

(58) Field of Classification Search
USPC .......................................... 427/248.1–255.7
See application file for complete search history.

(56) References Cited

U.S. PATENT DOCUMENTS

| | | | |
|---|---|---|---|
| 3,312,190 A | 4/1967 | Bradshaw | |
| 3,543,717 A | 12/1970 | Adachi | |
| 3,636,305 A | 1/1972 | Passmore | |
| 3,756,193 A | 9/1973 | Carmichael | |
| 3,931,490 A | 1/1976 | Grothe | |
| 3,931,789 A | 1/1976 | Kakei | |
| 3,971,334 A | 7/1976 | Pundsack | |
| 4,023,523 A | 5/1977 | Ing | |
| 4,187,801 A | 2/1980 | Monk | |
| 4,225,805 A | 9/1980 | Smithgall | |
| 4,233,937 A | 11/1980 | Steube | |
| 4,405,487 A | 9/1983 | Harrah | |
| 4,446,357 A | 5/1984 | Barshter | |
| 4,469,719 A | 9/1984 | Martin | |
| 4,543,467 A | 9/1985 | Eisele | |
| 4,592,306 A | 6/1986 | Gallego | |
| 4,596,735 A | 6/1986 | Noguchi | |
| 4,602,192 A | 7/1986 | Nomura | |
| 4,627,989 A | 12/1986 | Feuerstein | |
| 4,672,265 A | 6/1987 | Eguchi | |
| 4,769,292 A | 9/1988 | Tang | |
| 4,788,082 A * | 11/1988 | Schmitt ...................... | 427/248.1 |
| 4,885,211 A | 12/1989 | Tang | |
| 4,897,290 A | 1/1990 | Terasaka | |
| 4,951,601 A | 8/1990 | Maydan | |
| 5,139,598 A * | 8/1992 | Chou et al. ................ | 428/32.81 |
| 5,190,590 A | 3/1993 | Suzuki | |
| 5,258,325 A | 11/1993 | Spitzer | |
| 5,259,881 A | 11/1993 | Edwards | |
| 5,270,614 A * | 12/1993 | Kitagawa et al. ............ | 313/503 |
| 5,310,410 A | 5/1994 | Begin | |
| 2,351,536 A | 6/1994 | Osterberg | |
| 5,324,386 A * | 6/1994 | Murakami et al. ............. | 117/98 |
| 5,356,672 A * | 10/1994 | Schmitt et al. ................ | 427/446 |
| 5,429,884 A | 7/1995 | Namiki | |
| 5,512,320 A | 4/1996 | Turner | |
| 5,534,314 A | 7/1996 | Wadley | |
| 5,550,066 A | 8/1996 | Tang | |
| 5,643,685 A | 7/1997 | Torikoshi | |
| 5,670,792 A | 9/1997 | Utsugi | |
| 5,701,055 A | 12/1997 | Nagayama | |
| 5,720,821 A * | 2/1998 | Halpern ...................... | 118/719 |
| 5,817,366 A | 10/1998 | Arai | |
| 5,844,363 A | 12/1998 | Gu | |
| 5,902,688 A | 5/1999 | Antoniadis | |
| 5,904,961 A | 5/1999 | Tang | |
| 5,906,857 A | 5/1999 | Mckee | |
| 5,921,836 A | 7/1999 | Nanto | |
| 5,935,395 A | 8/1999 | Ouellet | |
| 5,943,600 A | 8/1999 | Ngan | |
| 5,945,967 A | 8/1999 | Rallison | |
| 5,972,183 A | 10/1999 | Krueger | |
| 6,001,413 A | 12/1999 | Matsuura | |
| 6,011,904 A | 1/2000 | Mattord | |
| 6,023,308 A | 2/2000 | Takemura | |
| 6,049,167 A | 4/2000 | Onitsuka | |
| 6,124,215 A | 9/2000 | Zheng | |
| 6,132,280 A | 10/2000 | Tanabe | |
| 6,132,805 A | 10/2000 | Moslehi | |
| 6,149,392 A | 11/2000 | Conte | |
| 6,179,923 B1 | 1/2001 | Yamamoto | |
| 6,237,529 B1 | 5/2001 | Spahn | |
| 6,244,212 B1 | 6/2001 | Takacs | |
| 6,280,861 B1 | 8/2001 | Hosokawa | |
| 6,294,892 B1 | 9/2001 | Utsugi | |
| 6,296,894 B1 | 10/2001 | Tanabe | |
| 6,299,746 B1 | 10/2001 | Conte | |
| 6,319,321 B1 | 11/2001 | Hiraga | |
| 6,326,726 B1 | 12/2001 | Mizutani | |
| 6,333,065 B1 | 12/2001 | Arai | |
| 6,337,102 B1 * | 1/2002 | Forrest et al. ................. | 427/64 |
| 6,337,105 B1 | 1/2002 | Kunieda | |
| 6,340,501 B1 | 1/2002 | Kamiyama | |
| 6,380,081 B1 | 4/2002 | Lee | |
| 6,403,392 B1 | 6/2002 | Burrows | |
| 6,432,561 B1 | 8/2002 | Yamazaki | |
| 6,469,439 B2 | 10/2002 | Himeshima | |
| 6,482,752 B1 | 11/2002 | Yamazaki | |
| 6,482,852 B2 | 11/2002 | Shakespeare | |
| 6,495,198 B2 | 12/2002 | Peng | |
| 6,528,108 B1 | 3/2003 | Kawamura | |
| 6,537,607 B1 | 3/2003 | Swanson | |
| 6,633,121 B2 | 10/2003 | Eida | |
| 6,641,674 B2 | 11/2003 | Peng | |
| 6,649,210 B2 | 11/2003 | Tokailin | |
| 6,660,409 B1 | 12/2003 | Furukawa | |
| 6,696,096 B2 | 2/2004 | Tsubaki | |
| 6,776,880 B1 | 8/2004 | Yamazaki | |
| 6,827,622 B2 | 12/2004 | Yamada | |
| 6,830,626 B1 | 12/2004 | Smith | |
| 2001/0006827 A1 | 7/2001 | Yamazaki | |
| 2001/0009154 A1 | 7/2001 | Nguyen | |
| 2001/0022272 A1 | 9/2001 | Plester | |
| 2002/0009538 A1 | 1/2002 | Arai | |
| 2002/0011205 A1 | 1/2002 | Yamazaki | |
| 2002/0017245 A1 | 2/2002 | Tsubaki | |
| 2002/0030443 A1 | 3/2002 | Konuma | |
| 2002/0076847 A1 | 6/2002 | Yamada | |
| 2002/0081372 A1 | 6/2002 | Peng | |
| 2002/0081767 A1 * | 6/2002 | Kawashima ................. | 438/99 |
| 2002/0084032 A1 | 7/2002 | Jeng | |
| 2002/0155632 A1 | 10/2002 | Yamazaki | |
| 2002/0187265 A1 | 12/2002 | Mori | |
| 2002/0192499 A1 | 12/2002 | Tokailin | |
| 2002/0197418 A1 | 12/2002 | Mizukami | |
| 2002/0197760 A1 | 12/2002 | Yamazaki | |
| 2003/0015140 A1 | 1/2003 | Van Slyke | |
| 2003/0017259 A1 | 1/2003 | Yamada | |
| 2003/0024479 A1 | 2/2003 | Kashiwaya | |
| 2003/0101937 A1 | 6/2003 | Van Slyke | |
| 2003/0124764 A1 * | 7/2003 | Yamazaki et al. ............. | 438/99 |
| 2003/0150384 A1 * | 8/2003 | Baude et al. ................. | 118/721 |
| 2003/0162314 A1 | 8/2003 | Yamazaki | |
| 2003/0180457 A1 | 9/2003 | Murakami | |
| 2003/0194484 A1 | 10/2003 | Yamazaki | |
| 2003/0219530 A1 | 11/2003 | Yamazaki | |
| 2004/0035360 A1 | 2/2004 | Yamazaki et al. | |
| 2004/0035366 A1 | 2/2004 | Keum | |
| 2004/0096694 A1 | 5/2004 | Tokailin | |
| 2005/0005850 A1 | 1/2005 | Yamazaki | |

FOREIGN PATENT DOCUMENTS

| | | |
|---|---|---|
| DE | 44 22697 | 1/1996 |
| EP | 0 955 791 | 11/1999 |
| EP | 1 071 117 | 1/2001 |
| EP | 1 113 087 | 7/2001 |
| JP | 54-127877 | 4/1979 |
| JP | 61-015969 | 1/1986 |
| JP | 61-284569 | 12/1986 |
| JP | 63-079959 | 4/1988 |
| JP | 63-079959 A | 4/1988 |
| JP | 63143262 A | 6/1988 |
| JP | 02-173261 | 7/1990 |
| JP | 04-268069 | 9/1992 |
| JP | 06-212425 A | 8/1994 |
| JP | 07-018426 | 1/1995 |
| JP | 09-256156 | 9/1997 |
| JP | 10-335062 | 12/1998 |
| JP | 2000-223269 | 8/2000 |
| JP | 2001-085164 | 3/2001 |
| JP | 2001-93667 | 4/2001 |
| JP | 2001-152336 | 6/2001 |
| JP | 2001-247959 | 9/2001 |

(56) References Cited

FOREIGN PATENT DOCUMENTS

| JP | 2004-035964 | 2/2004 |
|----|-------------|--------|
| WO | WO 98/54375 | 12/1998 |
| WO | WO 01/31081 | 5/2001 |

OTHER PUBLICATIONS

Webster's New World Dictionary, The World Publishing Co., 1972, pp. 821 and 822.
European Communication Search Report dated Jun. 18, 2003 for Application No. 03003757.6, (4 pages).
C. W. Tang and S. A. VanSlyke; "Organic electrolumineseent diodes"; Applied Physics Letter 51(12), Sep. 21, 1987; pp. 913-915.
S. A. Van Slyke, P.S. Bryan, and C. W. Tang; "Blue Organic Light Emitting Devices"; Proceedings of the Electroluminescence Workshop; Aug. 13-15, 1996, pp. 195-200.
European Communication dated Jun. 20, 2003 (4 pages).
Yoshinori Fukuda, et al.; "An organic LED display exhibiting pure RGB colors"; Synthetic Metals 111-112 (2000), pp. 1-6.
Merriam Webster's Collegiate Dictionary, 10th Edition (1998), p. 375.
C. W. Tang and S. A. VanSlyke; "Organic electroluminescent diodes"; Applied Physics Letters 51(12), Sep. 21, 1987; pp. 913-915.
S. A. Van Slyke, P.S. Bryan, and C. W. Tang; "Blue Organic Light Emitting Devices"; Proceedings of $8^{th}$ International Workshop on Inorganic and Organic Electroluminescence; (1996), pp. 195-200.
Van Slyke et al., "Linear Source Deposition of Organic layers for Full-Color OLED", *SID Digest '02, SID International Symposium Digest of Technical Papers*, pp. 886-889, Jan. 1, 2002.
Webster's New World Dictionary of the American Language Vol. Second College Edition, The World Publishing Co., 1972, pp. 821 and 822.
European Search Report (Application No. 12150311.4), dated Mar. 22, 2012, in English.

\* cited by examiner

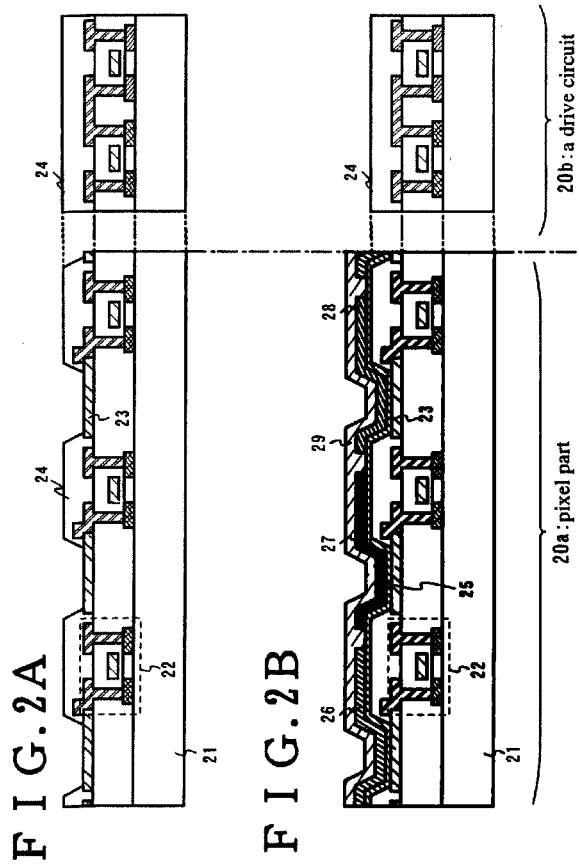

F I G. 6
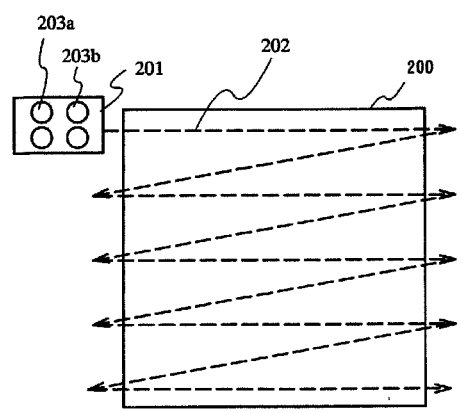

FABRICATION SYSTEM AND A FABRICATION METHOD OF A LIGHT EMITTING DEVICE

CROSS-REFERENCE TO RELATED APPLICATIONS

This application is a continuation of U.S. application Ser. No. 10/370,577, filed Feb. 24, 2003, now pending, which claims the benefit of a foreign priority application filed in Japan as Serial No. 2002-047508 on Feb. 25, 2002 both of which are incorporated by reference.

BACKGROUND OF THE INVENTION

Field of the Invention

The present invention relates to a fabrication apparatus having a deposition apparatus for use in deposition of materials allowed to be deposited by evaporation (hereafter, they are called evaporation materials). Particularly, the invention is an effective technique when organic materials are used as the evaporation materials.

Description of the Related Art

In recent years, the research of light emitting devices having EL elements as self-luminous elements has been conducted actively. In particular, a light emitting device using organic materials as EL materials is receiving attention. The light emitting device is also called an organic EL display or an organic light emitting diode.

In addition, the EL element has an anode, a cathode, and a layer containing organic compounds where an electric field is applied to obtain electroluminescence (hereafter, it is denoted by EL layer). Electroluminescence in the organic compounds has light emission (fluorescence) in returning from the singlet excited state to the ground state, and light emission (phosphorescence) in returning from the triplet excited state to the ground state. The light emitting devices fabricated by the deposition apparatus and a deposition method of the invention can be adapted to in either case of light emission.

As different from liquid crystal display devices, the light emitting devices have characteristics in that they have no problem about the viewing angle because they are a self-luminous type. More specifically, they are more suitable as displays used in outdoors than the liquid crystal displays. Various forms for use have been proposed.

The EL element has a structure in which the EL layer is sandwiched between a pair of electrodes. The EL layer generally has a multilayer structure. Typically, the multilayer structure of anode/hole transport layer/emissive layer/electron transport layer/cathode is named, which was proposed by Tang, Eastman Kodak Company. This structure has significantly high luminous efficiency, which is adopted for most of light emitting devices now under research and development.

Furthermore, other than this, these structures are fine to be layered over the anode in these orders: the structure of hole injection layer/hole transport layer/light emitting layer/electron transport layer, and alternatively the structure of hole injection layer/hole transport layer/light emitting layer/electron transport layer/electron injection layer. Moreover, it is acceptable to dope fluorescent dyes to the light emitting layer. Besides, it is fine that these layers are all formed of low weight molecular materials or all formed of polymeric materials.

In this specification, the entire layers disposed between the anode and the cathode are collectively called the EL layer. Accordingly, the hole injection layer, the hole transport layer, the light emitting layer, the electron transport layer, and the electron injection layer are all considered to be included in the EL layer.

In the specification, the light emitting element formed of the anode, the EL layer, and the cathode is called the EL element. The EL element has two systems: the system in which the EL layer is formed between two kinds of stripe electrodes disposed orthogonal to each other (simple matrix system), and the system in which the EL layer is formed between an opposite electrode and pixel electrodes connected to TFTs and arranged in matrix (active matrix system).

The EL materials forming the EL layer are generally classified into low weight molecular (monomer based) materials and polymeric (polymer based) materials. The low weight molecular materials are mainly deposited by evaporation.

The EL materials tend to be deteriorated extremely, which are easily oxidized and deteriorated by the existence of oxygen or moisture. On this account, photolithography processes cannot be performed after deposition. For patterning, deposition and separation need to be conducted simultaneously with a mask having opening parts (hereafter, it is called a mask). Therefore, almost all the sublimed organic EL materials have been deposited over the inner wall of a film-formation chamber or a wall-deposition shield (a protection plate for preventing the evaporation materials from being deposited over the inner wall of the film-formation chamber).

In a traditional evaporation apparatus, the space between a substrate and an evaporation source has been set wider in order to improve the uniformity of the film thickness, which has caused the apparatus itself to be large-sized. Moreover, because of the wide space between the substrate and the evaporation source, the deposition rate becomes slow, the time required to exhaust the inside of the film-formation chamber takes long time, and throughput drops.

In addition, in the traditional evaporation apparatus, the utilization efficiency for expensive EL materials is about one percent or below, which is extremely low to cause the fabrication costs of the light emitting device to be extremely high.

SUMMARY OF THE INVENTION

The EL materials are very expensive, and the unit price per gram is far more expensive than the unit price per gram for gold. Thus, it is desired to use them efficiently as much as possible. However, in the traditional evaporation apparatus, the utilization efficiency for expensive EL materials is low.

An object of the invention is to provide an evaporation apparatus enhancing the utilization efficiency for the EL materials and excellent in uniformity and throughput.

In the invention, typically, the distance d between the substrate and the evaporation source is narrowed to 30 cm or below in evaporation, and the utilization efficiency for the evaporation materials and throughput are improved significantly. The distance d between the space between the substrate and the evaporation source is narrowed, and thus the size of the film-formation chamber can be small-sized. Downsizing reduces the capacity of the film-formation chamber. Therefore, the time required for vacuuming can be shortened, the total amount of impurities inside the film-formation chamber can be decreased, and impurities (moisture and oxygen) can be prevented from being mixed in the highly purified EL materials. According to the invention, a response to the realization of further highly purified evaporation materials in future is feasible.

In addition to this, the invention is characterized in that an evaporation source holder having a container sealed with an evaporation material is moved to a substrate at a certain pitch in a film-formation chamber. In this specification, a fabrication system having the evaporation apparatus equipped with the movable evaporation source holder is called a moving cell cluster system. A single evaporation source holder can hold two or more crucibles, preferably four or six crucibles. In the invention, the evaporation source holder is moved. Thus, when the movement speed is fast, a mask is barely heated. Therefore, deposition failure caused by a thermally deformed mask can be suppressed as well.

A configuration of the invention to be disclosed in the specification is a fabrication system having a deposition apparatus, in which an evaporation material is evaporated from an evaporation source disposed opposite to a substrate and deposited over the substrate, said system comprising:
a film-formation chamber where the substrate is placed, said has film-formation chamber comprising:
the evaporation source; and
means for moving (a unit adapted to move) the evaporation source,
wherein the evaporation source is moved in the X-direction or the Y-direction, or zigzag for deposition.

Moreover, it is acceptable that a mechanism for rotating the substrate is disposed in the film-formation chamber, the substrate is rotated and the evaporation source is moved simultaneously in evaporation for deposition excellent in film thickness uniformity.

A configuration of the invention to be disclosed in the specification is a fabrication system having a deposition apparatus, the deposition apparatus in which an evaporation material is evaporated from an evaporation source disposed opposite to a substrate and deposited over the substrate,
a film-formation chamber where the substrate is placed has:
the evaporation source;
means for moving (a unit adapted to move) the evaporation source; and
means for rotating (a unit adapted to rotate) the substrate,
wherein the evaporation source is moved and the substrate is rotated simultaneously for deposition.

It is possible to form a fabrication system of a multi-chamber system. Another configuration of the invention is a fabrication system having a deposition apparatus, the fabrication system has:
a loading chamber;
a transport chamber joined to the loading chamber;
a film-formation chamber joined to the transport chamber, wherein the film-formation chamber includes:
an evaporation source;
means for moving (a unit adapted to move) the evaporation source;
means for rotating (a unit adapted to rotate) the substrate, wherein the evaporation source is moved and the substrate is rotated simultaneously for deposition.

In the configurations, the space between the evaporation source and the substrate is characterized by being 30 cm or below, preferably 5 to 15 cm.

In the configurations, the film-formation chamber is characterized by being joined to a vacuum processing chamber for vacuuming the film-formation chamber.

In the configurations, the evaporation source is characterized by being moved in at least of the X-direction and the Y-direction. In the configurations, a mask is disposed between the substrate and the evaporation source, and the mask is characterized by being a mask formed of a metal material having a low coefficient of thermal expansion.

In the configurations, the evaporation material is characterized by being an organic compound or a metal material.

When main processes, in which impurities such as oxygen and moisture are mixed in EL materials or metal materials for evaporation, are named, a process of setting the EL materials or the metal materials in the evaporation apparatus before evaporation and an evaporation process can be considered.

Generally, a container for storing an EL material is housed in a brown glass bottle that is closed with a plastic cap. It is also considered that the degree of sealing the container for storing the EL material is not enough.

Traditionally, in deposition by evaporation methods, a predetermined amount of an evaporation material contained in a container (glass bottle) is taken out and transferred to a container (typically, it is a crucible and an evaporation boat) placed at the position facing to a workpiece in the evaporation apparatus. In the transfer operation, impurities are likely to be mixed. More specifically, oxygen, moisture and other impurities are likely to be mixed, which are one cause of deteriorating the EL element.

In transferring the material from the glass bottle to the container, for example, it is considered that human hands transfer the material in a pretreatment chamber equipped with gloves in the evaporation apparatus. However, when the pretreatment chamber is equipped with the gloves, the chamber cannot be vacuumed, and thus the operation is done at an atmospheric pressure. Even though the operation is done in a nitrogen atmosphere, it has been difficult to reduce moisture and oxygen in the pretreatment chamber as much as possible. It is also considered to use a robot. However, the evaporation material is powder, and thus it is difficult to manufacture a transfer robot. Therefore, it has been difficult to manufacture a total closed system allowing that the process steps from the step of forming the EL layer over a lower electrode to the step of forming an upper electrode are all automated to avoid impurities from being mixed.

Then, in the invention, a fabrication system is formed in which EL materials and metal materials are directly housed in containers to be placed in the evaporation apparatus and they are deposited after transport, without using the traditional containers typically the brown glass bottle as the container storing the EL materials. The invention realizes preventing impurities from being mixed in the highly purified evaporation materials. Alternatively, it is acceptable that when the evaporation materials of the EL materials are directly housed, the evaporation materials are directly sublimed and purified in the container to be placed in the evaporation apparatus, without separately housing the obtained evaporation materials. According to the invention, a response to the realization of further highly purified evaporation materials in future is feasible. It is fine that metal materials are directly housed in the container to be placed in the evaporation apparatus and evaporated by resistance heating.

Desirably, a light emitting device manufacturer using the evaporation apparatus requests a material manufacturer to directly house the evaporation materials in the container to be placed in the evaporation apparatus, the material manufacturer fabricates or sells the evaporation materials.

Moreover, even though the highly purified EL materials are provided by the material manufacturer, the traditional transfer operation in the light emitting device manufacturer always has the risk of mixing impurities not to keep the purity of EL materials, which has given a limit in the purity. According to the invention, the light emitting device manufacturer cooperates with the material manufacturer to seek the reduction in mixed impurities, which maintains the highly purified EL materials obtained by the material manufacturer. Accordingly, the light emitting device manufacturer can evaporate them without deteriorating the purity.

BRIEF DESCRIPTION OF THE DRAWINGS

The teachings of the invention can be readily understood by considering the following detailed description in conjunction with the accompanying drawings, in which:

FIGS. 2A and 2B are cross sections illustrating Example 1;

FIG. 6 is a diagram illustrating one example of moving an evaporation source holder;

DESCRIPTION OF THE PREFERRED EMBODIMENT

The embodiment of the invention will be described below.

Embodiment

Figure 1A:
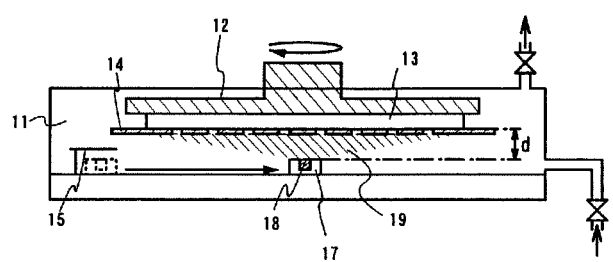
FIGS. 1A and 1B are diagrams illustrating Embodiment 1.
Figure 1B:
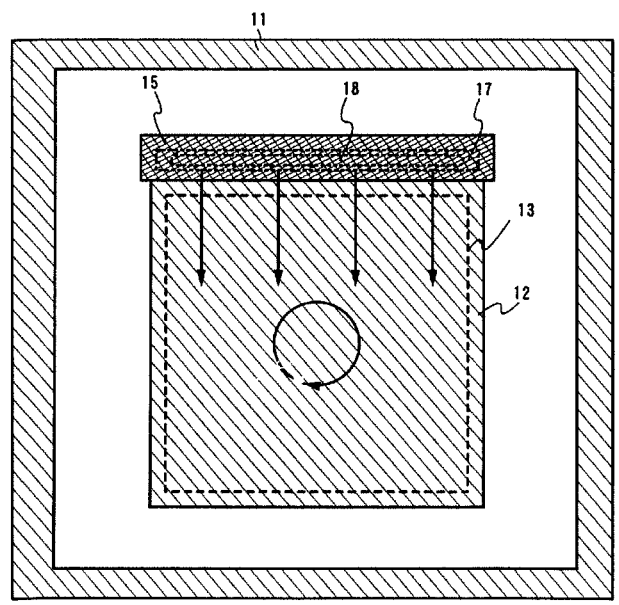

FIGS. 1A and 1B show a deposition apparatus of the invention. FIG. 1A is a cross section, and FIG. 1B is a top view.

In FIGS. 1A and 1B, reference numeral 11 denotes a film-formation chamber, reference numeral 12 denotes a substrate holder, reference numeral 13 denotes a substrate, reference numeral 14 denotes a mask, reference numeral 15 denotes a deposition shield (deposition shutter), reference numeral 17 denotes an evaporation source holder, reference numeral 18 denotes an evaporation material, and reference numeral 19 denotes an evaporated evaporation material.

Evaporation is conducted in the film-formation chamber 11 vacuumed at a vacuum degree of $5 \times 10^{-3}$ Torrs (0.665 Pa) or below, preferably vacuumed to $10^{-4}$ to $10^{-6}$ Pa. In evaporation, the evaporation material is evaporated (vaporized) by resistance heating beforehand. A shutter (not shown) is opened when evaporation, which causes the material to fly in the direction of the substrate 13. The evaporated evaporation material 19 is flown upward, passed through opening parts disposed in the mask 14, and selectively evaporated onto the substrate 13.

In the evaporation apparatus, the evaporation source holder is configured of a crucible, a heater disposed outside the crucible through a heat dissipating member, a heat insulating layer disposed outside the heater, an outer casing for housing them, a cooling pipe disposed around the outside of the outer casing, and a shutter device for opening and closing the opening part of the outer casing including the opening part of the crucible. In addition, in the specification, the crucible is a cylindrical container having a relatively large opening part, which is formed of a sintered compact of BN, a compound sintered compact of BN and AlN, or materials such as silica and graphite having resistance against high temperatures, high pressures and reduced pressures.

It is fine that the deposition rate can be controlled by a microcomputer.

In the evaporation apparatus shown in FIGS. 1A and 1B, the distance d between the substrate 13 and the evaporation source holder 17 is narrowed typically to 30 cm or below, preferably 20 cm or below, more preferably 5 to 15 cm in evaporation. Thus, the utilization efficiency for evaporation materials and throughput are improved significantly.

The substrate holder 12 is provided with a mechanism for rotating the substrate 13. The evaporation source holder 17 is provided with a mechanism of moving the holder in the X-direction or the Y-direction inside the film-formation chamber 11 as the holder remains horizontal. Here, the example of moving the holder in one direction was shown, which is not defined particularly. It is acceptable that the evaporation source holder 17 is moved in the X-direction or the Y-direction in a two-dimensional plane. Alternatively, it is fine that an evaporation source holder 201 is reciprocated in the X-direction or the Y-direction for several times, moved slantly, or moved in an arc shape. The evaporation source holder 201 may be moved with a constant acceleration. Also, The evaporation source holder 201 source may be moved slowing down or accelerating near an edge portion of a substrate. For example, as one example shown in FIG. 6, it is fine to move the evaporation source holder 201 zigzag. In FIG. 6, reference numeral 200 denotes a substrate, reference numeral 201 denotes the evaporation source holder, and reference numeral 202 denotes the direction of moving the evaporation source holder. In FIG. 6, four crucibles can be placed in the evaporation source holder 201. An evaporation material 203a and an evaporation material 203b are filled in the separate crucibles.

The evaporation apparatus shown in FIGS. 1A and 1B is characterized in that the substrate 13 is rotated and the evaporation source holder 17 is moved simultaneously in evaporation, and thus deposition excellent in film thickness uniformity is conducted.

It is acceptable that a deposition shutter is disposed in the movable evaporation source holder 17. It is fine that an organic compound provided in a single evaporation source holder is not necessarily a single compound, which can be multiple compounds. For example, it is acceptable that another organic compound (dopant material) to be a dopant is provided in the evaporation source, other than one kind of material provided as a luminous organic compound. Preferably, an organic compound layer to be deposited is configured of a host material and a luminescent material (dopant material) having excitation energy lower than that of the host material, and the excitation energy of dopant is designed to be lower than the excitation energy in the hole transport region and the excitation energy of the electron transport layer. Accordingly, the molecular excitons of the dopant are prevented from being diffused, and the dopant can emit light efficiently. When the dopant is a carrier trap material, the recombination efficiency of carrier can be enhanced as well. The case where a material capable of converting triplet excitation energy into light emission is mixed in the mixing region as a dopant is also included in the invention. As the formation of the mixing region, it is fine that the mixing region has a concentration gradient.

When a plurality of organic compounds is provided in a single evaporation source holder, it is desirable that the direction of the compounds evaporating is set slantly so as to cross at the position of a workpiece for mixing the organic compounds together. In order to conduct coevaporation, the evaporation source holder 201 is acceptable to have four evaporation materials (two kinds of host materials as the evaporation materials a and two kinds of dopant materials as the evaporation materials b) as shown in FIG. 6.

Because of narrowing the distance d between the substrate 13 and the evaporation source holder 17 to typically 30 cm or below, preferably 5 to 15 cm, the mask 14 might be heated. Therefore, for the mask 14, it is desirable to use metal materials having a low coefficient of thermal expansion, which are hardly thermally deformed, (for example, refractory metals such as tungsten, tantalum, chromium, nickel and molybdenum or alloys containing these elements, and materials such as stainless steel, inconel, and hastelloy). For example, low thermal expansion alloys such as 42% of nickel and 58% of iron are named. In order to cool the mask to be heated, it is fine that the mask is provided with a mechanism for circulating a cooling medium (cooling water and cooling gas).

The mask 14 is used for selectively depositing a film, which is not needed in depositing a film over throughout the surface particularly.

The substrate holder 12 is provided with a permanent magnet, which fixes the mask made of metal by magnetic force and the substrate 13 sandwiched therebetween as well. The example of the mask closely contacting the substrate 13 was shown here. However, it is fine to properly provide a substrate holder for fixing the substrate with some space or a mask holder.

The film-formation chamber 11 is joined to a vacuum processing chamber for vacuuming the film-formation chamber. As the vacuum processing chamber, a magnetic levitated turbo-molecular pump, a cryopump, and a dry-sealed vacuum pump are provided. Accordingly, the ultimate vacuum of the transport chamber can be set at $10^{-5}$ to $10^{-6}$ Pa, and the back diffusion of impurities from the pump side and an exhaust system can be controlled. In order to prevent impurities from being introduced into the apparatus, an inert gas such as nitrogen and a rare gas are used for the gas to be introduced. The gases to be introduced into the apparatus are highly purified by a gas purifier before they are introduced into the apparatus. Therefore, the gas purifier needs to be provided so that gases are highly purified and then introduced into the evaporation apparatus. Accordingly, oxygen, moisture and other impurities contained in the gases can be removed beforehand. Thus, the impurities can be prevented from being introduced into the apparatus.

It is fine that a plasma generating unit is provided in the film-formation chamber 11, plasma (plasma generated by exciting one or a plurality of kinds of gases selected from Ar, H, F, $NF_3$ or O) is generated in the film-formation chamber in the state that the substrate is not placed, deposited products deposited over the inner wall of the film-formation chamber, the wall-deposition shield, or the mask are vaporized and exhausted out of the film-formation chamber for cleaning. In this manner, the inside of the film-formation chamber can be cleaned without being exposed to atmosphere at the time of maintenance. In addition, the vaporized organic compounds in cleaning can be collected by the exhaust system (vacuum pump) and recycled.

The invention formed of the configurations will be described further in detail by examples below.

EXAMPLE

Example 1

Here, the process steps of fabricating an active matrix light emitting device having a pixel part and a drive circuit on the same substrate and including an EL-element is exemplified and described in FIGS. 2A and 2B.

First, as shown in FIG. 2A, a thin film transistor (hereafter, it is called a TFT) 22 is formed over a substrate 21 having an insulated surface by publicly known fabrication process steps. In a pixel part 20a, an n-channel TFT and a p-channel TFT are formed. Here, the p-channel TFT for feeding current to an organic light emitting element is illustrated in the drawing. It is acceptable that the TFT for feeding current to the organic light emitting element is the n-channel TFT or the p-channel TFT. In a drive circuit 20b disposed around the pixel part, the n-channel TFT, the p-channel TFT, and a CMOS circuit that complementally combines them are formed. Here, an example is shown in which an anode 23 formed of a transparent conductive oxide film (ITO (indium tin oxide alloy), indium oxide-zinc oxide alloy ($In_2O_3$—ZnO), and zinc oxide (ZnO)) is formed in matrix, and then wiring lines to connect to an active layer of the TFTs are formed. Subsequently, an insulating film 24 formed of an inorganic material or an organic material for covering the end parts of the anode 23 is formed.

Then, as shown in FIG. 2B, an organic compound layer (EL layer) for forming the EL element is deposited.

First, the anode 23 is cleaned as pretreatment. As cleaning of the anode surface, ultraviolet ray irradiation in a vacuum or oxygen plasma processing is conducted to clean the anode surface. As oxidation, it is fine that ultraviolet rays are irradiated in an atmosphere containing oxygen as the substrate is heated at temperatures of 100 to 120° C., which is effective in the case where the anode is an oxide such as ITO. As annealing, it is acceptable that the substrate is annealed at a heating temperature of 50° C. or above where the substrate can resist in a vacuum, preferably at temperatures of 65 to 150° C., for removing impurities such as oxygen and moisture attached in the substrate and impurities such as oxygen and moisture in the thin film deposited over the substrate. Particularly, the EL materials tend to be deteriorated by impurities such as oxygen and moisture, and thus annealing in a vacuum is effective before evaporation.

Subsequently, the substrate is transferred to a film-formation chamber to be the deposition apparatus shown in FIGS. 1A and 1B without being exposed to atmosphere, and a hole transport layer, a hole injection layer, or a light emitting layer, which are one of the organic compound layer, is properly layered over the anode 23. Here, the evaporation source provided in the film-formation chamber to be the deposition apparatus shown in FIGS. 1A and 1B is heated for evaporation, and a hole injection layer 25, a light emitting layer (R) 26, a light emitting layer (G) 27, and a light emitting layer (B) 28 are deposited. The light emitting layer (R) is a light emitting layer emitting red light, the light emitting layer (G) is a light emitting layer emitting green light, and the light emitting layer (B) is a light emitting layer emitting blue light. The deposition apparatus shown in FIGS. 1A and 1B is used for evaporation, which can significantly improve the film thickness uniformity of the organic compound layer, the utilization efficiency for evaporation materials, and throughput.

Then, a cathode 29 is formed. It is acceptable that the film-formation chamber shown in FIGS. 1A and 1B is used for forming the cathode 29. The deposition apparatus shown in FIGS. 1A and 1B is used for evaporation, which can significantly improve the film thickness uniformity of the cathode, the utilization efficiency for evaporation materials, and throughput.

As materials used for the cathode 29, it is considered preferable to use metals having a small work function (typically, metal elements in the Group 1 or the Group 2 of the periodic table), or alloys containing them. The smaller the work function is, the more enhanced luminous efficiency is. Thus, as the materials used for the cathode, alloy materials containing Li (lithium), which is one of alkali metals, are desirable among them. The cathode also functions as the wiring line shared by the entire pixels, which has a terminal electrode at an input terminal part through the wiring lines.

Subsequently, it is preferable that the substrate is encapsulated by a protection film, an encapsulation substrate, or an encapsulation can, and the organic light emitting device is fully blocked from the outside to prevent matters in the outside from entering, the matters cause deterioration due to oxidation of the EL layer by moisture and oxygen. It is acceptable to provide a desiccant.

Then, an FPC (flexible printed circuit) is bonded to the electrodes in an input and output terminal part with an anisotropic conductive material. The anisotropic conductive material is formed of a resin and conductive particles plated with Au having a diameter of a few to a few hundreds micrometers in which the conductive particles electrically connect the electrodes in the input and output terminal part to the wiring lines formed in the FPC.

It is fine to provide an optical film such as a circularly polarizing plate configured of a polarizing plate and a retarder, or to mount an IC chip, as required.

According to the process steps, a module type active matrix light emitting device connected with the FPC is completed.

Moreover, the example that the anode is the transparent conductive film to layer the anode, the organic compound layer, and the cathode in this order was shown here. However, the invention is not limited to this multilayer structure. It is acceptable that the cathode, the organic compound layer, and the anode are sequentially layered, or that the anode is a metal layer to layer the anode, the organic compound layer, and a cathode having translucency in this order.

The example of the top gate TFT was shown here as the structure of the TFT. However, the invention can be adapted regardless of the TFT structure. For example, it can be adapted to a bottom gate (inversely staggered) TFT and a staggered TFT.

Example 2

Figure 3:
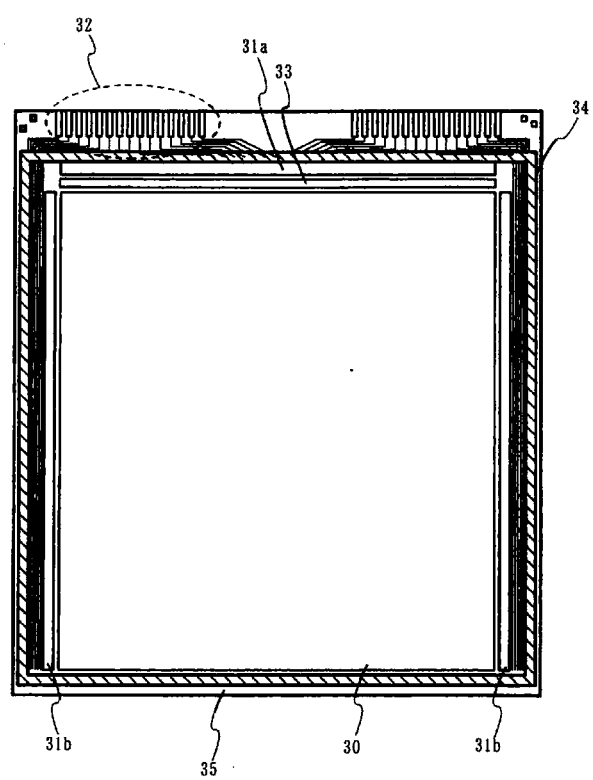
FIG. 3 is a diagram illustrating the top view of a light emitting device.

FIG. 3 is a diagram illustrating the appearance of the top view of an El module. In a substrate (it is also called a TFT substrate) 35 where a countless number of TFTs are formed, a pixel part 30 for display, drive circuits 31a and 31b for driving the pixels in the pixel part, connecting parts for connecting a cathode disposed over an EL layer to interconnect wiring lines, and terminal parts 32 for bonding an FPC to connect external circuits are disposed. The module is sealed with a substrate for encapsulating the EL element and a sealing material 34.

In FIG. 3, the cross section of the pixel part is not defined particularly. Here, the cross section shown in FIG. 2B is exemplified. The module shown in FIG. 3 is a product after the encapsulation process in which a protection film or an encapsulation substrate was bonded to the product having the cross sectional structure shown in FIG. 2B.

An insulating film is formed over the substrate, and the pixel part and the drive circuits are formed in the upper part of the insulating film. The pixel part is formed of a plurality of pixels including a current controlling TFT and a pixel electrode electrically connected to the drain. The drive circuits are formed by using a CMOS circuit combining an n-channel TFT and a p-channel TFT.

It is fine to form these TFTs by using publicly known techniques.

The pixel electrode functions as the anode of the light emitting element (organic light emitting element). An insulating film called a bank is formed on both ends of the pixel electrode, and an organic compound layer and the cathode of the light emitting element are formed over the pixel electrode.

The cathode functions as the wiring line shared by the entire pixels, which is electrically connected to the terminal part connecting to the FPC through connection wiring lines. Devices included in the pixel part and the drive circuits are all covered with the cathode and a protection film. It is fine to bond the substrate to a cover material (a substrate for encapsulation) with an adhesive. It is acceptable that a recessed part is disposed in the cover material to place a desiccant.

The example can be freely combined with the embodiment.

Example 3

The example 1 shows the example of fabricating the top gate TFT (more specifically, it is a planar TFT) as the TFT 22. In this example, a TFT 42 is used instead of the TFT 22. The TFT 42 used in the example is a bottom gate TFT (more specifically, it is an inversely staggered TFT), which is fine to be fabricated by publicly known fabrication process steps.

Figure 4:
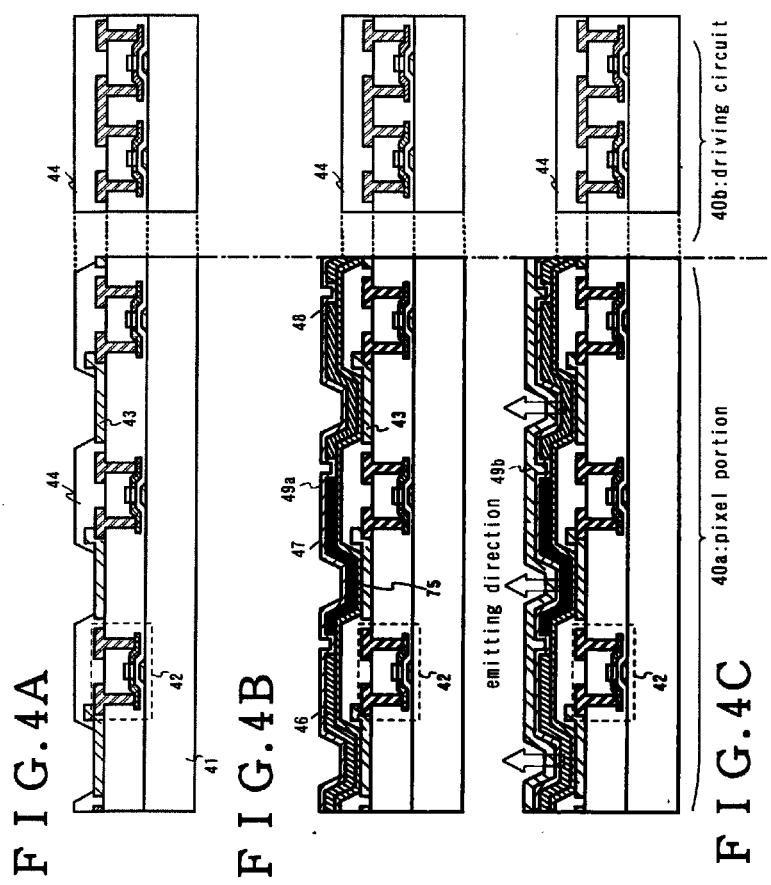
FIGS. 4A, 4B and 4C are cross sections illustrating Example 3.

First, as shown in FIG. 4A, the bottom gate TFT 42 is formed over a substrate 41 having an insulated surface by publicly known fabrication process steps. Here, the example is shown that the TFT is formed and then an anode 43 is formed in matrix, the anode 43 is formed of a metal layer (a conductive material containing one kind or a plurality of elements selected from Pt, Cr, W, Ni, Zn, Sn and In).

Subsequently, an insulating film 44 for covering the end parts of the anode 43 is deposited, which is formed of an inorganic material or an organic material.

Then, as shown in FIG. 4B, an organic compound layer for forming an EL element (EL layer) is deposited. The substrate is transferred to a film-formation chamber provided with an evaporation source, and a hole transport layer, a hole injection layer, or a light emitting layer, which are one of the organic compound layer, is properly layered over the anode 43. Here, evaporation is conducted in the deposition apparatus shown in FIGS. 1A and 1B, and a hole injection layer 45, a light emitting layer (R) 46, a light emitting layer (G) 47, and a light emitting layer (B) 48 are deposited. The deposition apparatus shown in FIGS. 1A and 1B is used for evaporation, which can significantly improve the film thickness uniformity of the organic compound layer, the utilization efficiency for evaporation materials, and throughput.

Subsequently, a cathode 49a to be an under layer is formed by the deposition apparatus shown in FIGS. 1A and 1B. The deposition apparatus shown in FIGS. 1A and 1B is used for evaporation, which can significantly improve the film thickness uniformity of the cathode 49a, the utilization efficiency for evaporation materials, and throughput. For the cathode 49a to be the under layer, it is preferable to use an extremely thin metal film (a film deposited by coevaporation of aluminum and an alloy such as MgAg, MgIn, AlLi and CaN or an element in the Group 1 or the Group 2 of the periodic table) or a multilayer of these.

Then, an electrode 49b is formed over the cathode 49a (FIG. 4C. For the electrode 49b, it is fine to use a transparent conductive oxide film (ITO (indium tin oxide alloy), indium oxide-zinc oxide alloy ($In_2O_3$—$ZnO$), and zinc oxide ($ZnO$)). The multilayer structure shown in FIG. 4C is the case where light is emitted in the direction of arrows shown in the drawing (light is passed through the cathode). Thus, preferably, conductive materials having translucency are used as the electrode including the cathode.

The process steps after this step are the same as those of the module type active matrix light emitting device shown in the example 1, thus omitting the description here.

The example can be freely combined with any of the embodiment, the example 1 or 2.

Example 4

Figure 5:
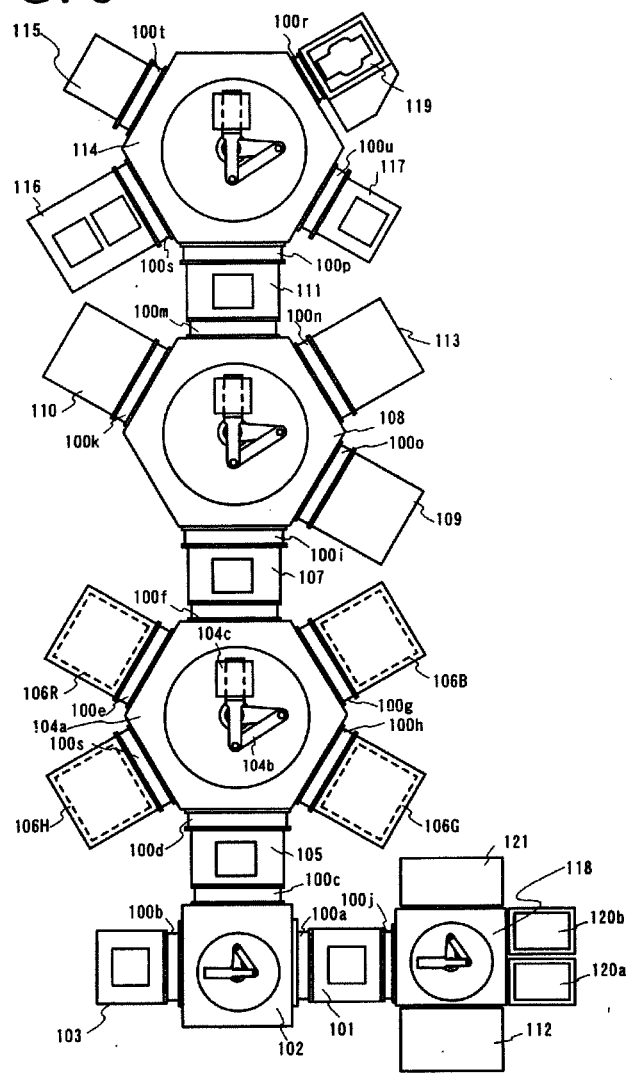
FIG. 5 is a diagram illustrating a fabrication system of a multi-chamber system (Example 4)

In this example, FIG. 5 shows a fabrication system of a multi-chamber system in which the fabrication steps are fully automated up to upper electrode fabrication.

In FIG. 5, 100a to 100k and 100m to 100u denote gates, 101 denotes a preparation chamber, 119 denotes a take-out chamber, 102, 104a, 108, 114 and 118 denote transport chambers, 105, 107 and 111 denote delivery chambers, 106R, 106B, 106G, 109, 110, 112 and 113 denote film-formation chambers, 103 denotes a pretreatment chamber, 117 denotes an encapsulation substrate loading chamber, 115 denotes a dispenser chamber, 116 denotes an encapsulation chamber, 120a and 120b denote cassette chambers, and 121 denotes a tray mounting stage.

Hereafter, the procedures will be shown that a substrate formed with the TFT 22 and the anode 23 beforehand is transferred in the fabrication system shown in FIG. 5 to form the multilayer structure shown in FIG. 2B.

First, the substrate formed with the TFT and the anode 23 is set in the cassette chamber 120a or the cassette chamber 120b. When the substrate is a large-sized substrate (300 mm×360 mm, for example), it is set in the cassette chamber 120b. When the substrate is a general substrate (127 mm×127 mm, for example), it is transferred to the tray mounting stage 121. Then, several substrates are placed in a tray (300 mm×360 mm, for example).

Then, the substrate is transferred from the transport chamber 118 provided with a substrate transport mechanism to the preparation chamber 101.

The preparation chamber 101 is joined to a vacuum processing chamber. Preferably, the preparation chamber 101 is vacuumed and then an inert gas is introduced to set at atmospheric pressure. Subsequently, the substrate is transferred to the transport chamber 102 joined to the preparation chamber 101. The transport chamber is vacuumed to keep a vacuum beforehand so as not to exist moisture and oxygen.

The transport chamber 102 is joined to a vacuum processing chamber for vacuuming the transport chamber. As the vacuum processing chamber, a magnetic levitated turbo-molecular pump, a cryopump or a dry-sealed vacuum pump is provided. Accordingly, the ultimate vacuum in the transport chamber can be set at 105' to 104 Pa, and the back diffusion of impurities from the pump side and an exhaust system can be controlled. In order to prevent impurities from being introduced into the apparatus, an inert gas such as nitrogen and a rare gas is used for the gas to be introduced. The gases to be introduced into the apparatus are highly purified by a gas purifier before introduced into the apparatus. Therefore, the gas purifier needs to be equipped so that gases are highly purified and then introduced into the evaporation apparatus. Accordingly, oxygen, moisture and other impurities contained in the gases can be removed beforehand. Thus, the impurities can be prevented from being introduced into the apparatus.

In order to remove moisture and other gases contained in the substrate, the substrate is preferably annealed for deaeration in a vacuum. It is fine that the substrate is transferred to the pretreatment chamber 103 joined to the transport chamber 102 for annealing. When the anode surface needs to be cleaned, it is fine to carry the substrate to the pretreatment chamber 103 joined to the transport chamber 102 for cleaning.

It is acceptable that an organic compound layer formed of polymers is deposited over throughout the anode. The film-formation chamber 112 is the film-formation chamber for depositing the organic compound layer formed of polymers. In the example, the example is shown that poly (styrene-sulfonate)/poly(ethylenedioxythiophene) (PEDOT/PSS) aqueous solution, which functions as the hole injection layer 25, is deposited over throughout the surface. When the organic compound layer is deposited in the film-formation chamber 112 by spin coating, ink-jet deposition, or spraying, the surface of the substrate for deposition is set upward under atmospheric pressure. In the example, the delivery chamber 105 is provided with a substrate reversing mechanism that properly reverses the substrate. After deposition with aqueous solution, the substrate is preferably transferred to the pretreatment chamber 103 and annealed in a vacuum to vaporize moisture. In the example, the example of depositing the hole injection layer 25 made of polymers was shown. However, it is acceptable that the hole injection layer made of a low weight molecular organic material is deposited by evaporation based on resistance heating, or the hole injection layer 25 is not provided in particular.

Subsequently, the substrate 104c is transferred from the transport chamber 102 to the delivery chamber 105 without being exposed to atmosphere. Then, the substrate 104c is transferred to the transport chamber 104, and it is transferred to the film-formation chamber 106R by a transport mechanism 104b to properly deposit an EL layer 26 for emitting red light over the anode 23. Here, it is deposited by evaporation based on resistance heating. For the film-formation chamber 106R, the surface of the substrate for deposition is set downward in the delivery chamber 105. Before the substrate is transferred, the film-formation chamber is preferably vacuumed.

Evaporation is performed in the vacuumed film-formation chamber 106R where the degree of vacuum is reduced to $5\times10^{-3}$ Torrs (0.665 Pa) or below, for example, preferably $10^{-4}$ to $10^{-6}$ Pa. In evaporation, the organic compound is vaporized by resistance heating beforehand. A shutter (not shown) is opened in evaporation, which causes the compound to fly in the direction of the substrate. The vaporized organic compound is flown upward, and deposited over the substrate through the opening part (not shown) disposed in a metal mask (not shown).

In the example, the deposition apparatus shown in FIGS. 1A and 1B is used for deposition. The deposition apparatus shown in FIGS. 1A and 1B is used for evaporation, which can significantly improve the film thickness uniformity of the organic compound layer, the utilization efficiency for evaporation materials, and throughput.

Here, for the provision of full color, the substrate undergoes deposition in the film-formation chamber 106R, and then the substrate undergoes deposition sequentially in the film-formation chambers 106G and 106B to properly form organic compound layers 26 to 28 showing light emission of red, green and blue.

The hole injection layer 25 and the desired EL layers 26 to 28 are formed over the anode 23, and then the substrate is transferred from the transport chamber 104a to the delivery chamber 107 without being exposed to atmosphere. Subsequently, the substrate is further transferred from the delivery chamber 107 to the transport chamber 108 without being exposed to atmosphere.

After that, a transport mechanism provided in the transport chamber 108 transfers the substrate to the film-formation chamber 110, and a cathode 29 formed of a metal layer is properly deposited by an evaporation method based on resistance heating. Here, the film-formation chamber 110 is an evaporation apparatus having Li and Al in the evaporation source for evaporation by resistance heating.

According to the process steps, the light emitting element of the multilayer structure shown in FIG. 2B is fabricated.

Then, the substrate is transferred from the transport chamber 108 to the film-formation chamber 113 without being exposed to atmosphere, and a protection film formed of a silicon nitride film or a silicon nitride oxide film is deposited. Here, the film-formation chamber 113 is a sputtering apparatus provided with a target made of silicon, a target made of silicon oxide, or a target made of silicon nitride inside. For example, the target made of silicon is used, and the atmosphere of the film-formation chamber is set in a nitrogen atmosphere or an atmosphere containing nitrogen and argon, which allows a silicon nitride film to be deposited.

Subsequently, the substrate formed with the light emitting element is transferred from the transport chamber 108 to the delivery chamber 111 without being exposed to atmosphere, and it is further transferred from the delivery chamber 111 to the transport chamber 114.

After that, the substrate formed with the light emitting element is transferred from the transport chamber 114 to the encapsulation chamber 116. An encapsulation substrate with a sealing material is preferably prepared in the encapsulation chamber 116.

The encapsulation substrate is set in the encapsulation substrate loading chamber 117 from outside. In order to remove impurities such as moisture, annealing is preferably performed in a vacuum beforehand. For example, the substrate is annealed in the encapsulation substrate loading chamber 117. When the sealing material is formed on the encapsulation substrate, the transport chamber 114 is set at an atmospheric pressure, the encapsulation substrate is transferred from the encapsulation substrate loading chamber to the dispenser chamber 115 to form the sealing material to be bonded to the substrate formed with the light emitting element. Then, the encapsulation substrate formed with the sealing material is transferred to the encapsulation chamber 116.

Subsequently, to degas the substrate formed with the light emitting element, the substrate is annealed in a vacuum or an inert atmosphere, and then the encapsulation substrate formed with the sealing material is bonded to the substrate formed with the light emitting element. Here, the example of forming the sealing material on the encapsulation substrate was shown, which is not defined particularly. It is fine that the sealing material is formed on the substrate formed with the light emitting element.

Then, ultraviolet rays are irradiated onto a set of the bonded substrates by an ultraviolet ray irradiation mechanism provided in the encapsulation chamber 116 to cure the sealing material. Here, a UV curable resin was used as the sealing material, which is not limited particularly as long as it is an adhesive.

Subsequently, the set of the bonded substrates is transferred from the encapsulation chamber 116 to the transport chamber 114, and from the transport chamber 114 to the take-out chamber 119, for taking it out.

As described above, the fabrication system shown in FIG. 5 is used, which does not expose the light emitting element to ambient air entirely until it is encapsulated in the enclosed space. Thus, a highly reliable light emitting device can be fabricated. A vacuum and a nitrogen atmosphere at an atmospheric pressure are repeated in the transport chamber 114, but desirably, the transport chambers 102, 104a and 108 are always kept in a vacuum.

Alternatively, a deposition apparatus of an inline system is feasible.

Hereafter, the procedures will be shown that the substrate formed with a TFT and an anode beforehand is transferred to the fabrication system shown in FIG. 5 and the multilayer structure shown in FIG. 4C is formed.

First, a substrate formed with the TFT and the anode 43 is set in the cassette chamber 120a or the cassette chamber 120b, as similar to the case of forming the multilayer structure shown in FIG. 2A.

Then, the substrate is transferred from the transport chamber 118 provided with the substrate transport mechanism to the preparation chamber 101. Subsequently, the substrate is transferred to the transport chamber 102 joined to the preparation chamber 101.

In order to remove moisture and other gases contained in the substrate, the substrate is preferably annealed for deaeration in a vacuum. It is fine that the substrate is transferred to the pretreatment chamber 103 joined to the transport chamber 102 for annealing. When the anode surface needs to be cleaned, the substrate is transferred to the pretreatment chamber 103 joined to the transport chamber 102 for cleaning.

It is acceptable that an organic compound layer made of polymers is formed over throughout the anode. The film-formation chamber 112 is a film-formation chamber for depositing the organic compound layer made of polymers. For example, it is fine that poly(styrenesulfonate)/poly(ethylenedioxythiophene) (PEDOT/PSS) aqueous solution, which functions as a hole injection layer 45, is deposited over throughout the surface. When the organic compound layer is deposited in the film-formation chamber 112 by spin coating, ink-jet deposition, and spraying, the surface of the substrate for deposition is set upward under atmospheric pressure. The delivery chamber 105 is provided with the substrate reversing mechanism that reverses the substrate properly. After deposition with the aqueous solution, the substrate is preferably transferred to the pretreatment chamber 103 for annealing in a vacuum to vaporize moisture.

Subsequently, the substrate 104c is transferred from the transport chamber 102 to the delivery chamber 105 without being exposed to atmosphere, and then the substrate 104c is transferred to the transport chamber 104. The substrate is transferred to the film-formation chamber 106R by the transport mechanism 104b, and an EL layer 46 for emitting red light is properly deposited over the anode 43. Here, it is deposited by evaporation using the deposition apparatus shown in FIGS. 1A and 1B. The deposition apparatus shown in FIGS. 1A and 1B is used for evaporation, which can significantly improve the film thickness uniformity of the organic compound layer, the utilization efficiency for evaporation materials, and throughput.

Here, for the provision of full color, the substrate undergoes deposition in the film-formation chamber 106R, and then the substrate undergoes deposition in the film-formation chambers 106G and 106B to properly deposit organic compound layers 46 to 48 showing light emission of red, green and blue.

The hole injection layer 45 and the desired EL layer 46 to 48 are formed over the anode 43, and then the substrate is transferred from the transport chamber 104a to the delivery chamber 107 without being exposed to atmosphere. Then, the substrate is further transferred from the delivery chamber 107 to the transport chamber 108 without being exposed to atmosphere.

After that, the substrate is transferred to the film-formation chamber 110 by the transport mechanism equipped in the transport chamber 108, and a cathode (under layer) 49a formed of an extremely thin metal film (a film deposited by codeposition method of aluminum and an alloy such as MgAg, MgIn, AlLi and CaN or an element in the Group 1 or the Group 2 of the periodic table) by the deposition apparatus shown in FIGS. 1A and 1B. The cathode (under layer) 49a formed of the thin metal layer is deposited. Then, the substrate is transferred to the film-formation chamber 109 where an electrode (upper layer) 49b formed of a transparent conductive film (ITO (indium tin oxide alloy), indium oxide-zinc oxide alloy ($In_2O_3$—ZnO), and zinc oxide (ZnO)) is deposited by sputtering to properly form the electrodes 49a and 49b of the multilayer of the thin metal layer and the transparent conductive film.

According to the process steps, the light emitting element of the multilayer structure shown in FIG. 4C is fabricated. The light emitting element of the multilayer structure shown in FIG. 4C emits light in the direction indicated by arrows in the drawing, which emits light inversely as the light emitting element shown in FIG. 2B.

The process steps after this are the same as the procedures of fabricating the light emitting device having the multilayer structure shown in FIG. 2A, thus omitting the description.

As described above, when the fabrication system shown in FIG. 5 is used, the multilayer structures shown in FIGS. 2B and 4C can be fabricated separately. The deposition apparatus shown in FIGS. 1A and 1B is used for evaporation, which can significantly improve the film thickness uniformity of the organic compound layer, the utilization efficiency for evaporation materials, and throughput.

The example can be combined freely with any of the embodiment, and the examples 1 to 3.

Example 5

Figure 7:
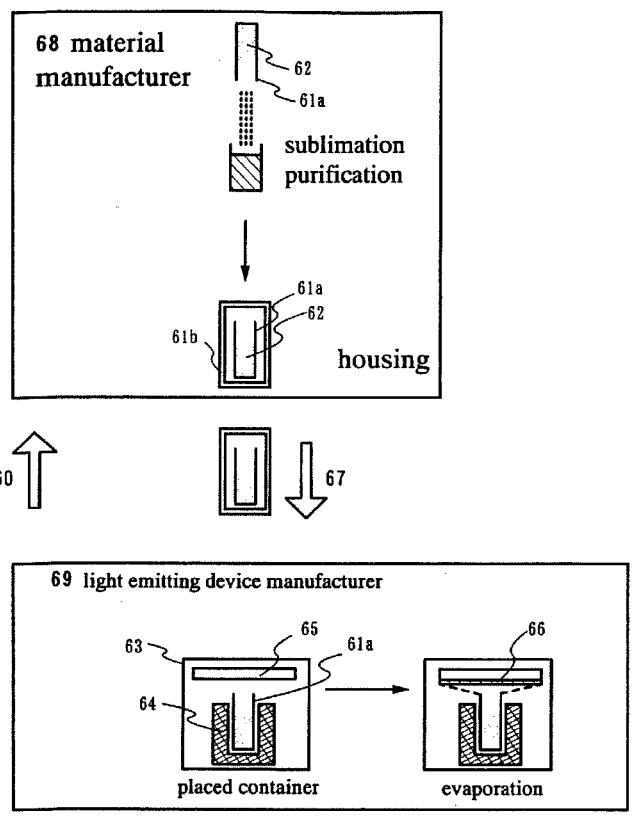
FIG. 7 is a diagram illustrating Example 5.

FIG. 7 shows an explanatory view of a fabrication system of this example.

In FIG. 7, reference numeral 61a denotes a first container (crucible), and 61b denotes a second container for separating the first container from atmosphere to prevent the first container from being contaminated. Reference numeral 62 denotes a powder EL material highly purified. Reference numeral 63 denotes a vacuumable chamber, reference numeral 64 denotes a heating unit, reference numeral 65 denotes a workpiece, and reference numeral 66 denotes a film. Reference numeral 68 denotes a material manufacturer that is a manufacturer (typically, a raw material handler) producing and purifying organic compound materials to be the evaporation materials, and reference numeral 69 denotes a light emitting device manufacturer having an evaporation apparatus that is a manufacturer (typically, a production plant) of light emitting devices.

The flow of the manufacturing system of the example will be described below.

First, the light emitting device manufacturer 69 places an order 60 to the material manufacturer 68. The material manufacturer 68 prepares the first container and the second container in compliance with the order 60. Then, the material manufacturer purifies or houses the highly purified EL material 62 in the first container 61a in a clean room environment with sufficient attention to impurities (oxygen and moisture) not to be mixed. After that, the material manufacturer 68 preferably seals the first container 61a in the second container 61b so as not to attach unnecessary impurities to the inside or outside of the first container in the clean room environment. In sealing, the inside of the second container 61b is preferably vacuumed or filled with an inert gas. Preferably, the first container 61a and the second container 61b are cleaned before the highly purified EL material 62 is purified or housed.

In the example, the first container 61a is placed in a chamber as it is in evaporation later. It is acceptable that the second container 61b is a packaging film with a barrier property for blocking oxygen and moisture from being mixed. However, the second container is preferably a strong container in a cylindrical shape or a box shape having a light shielding property for automatic pickup.

Subsequently, as the first container 61a is sealed in the second container 61b, the material manufacturer 68 makes transport 67 to the light emitting device manufacturer 69.

Then, as the first container 61a is sealed in the second container 61b, they are placed in the vacuumable process chamber 63. The process chamber 63 is an evaporation chamber having the heating unit 64 and a substrate holder (not shown) provided inside. After that, the process chamber 63 is vacuumed and cleaned with oxygen and moisture reduced as much as possible, the first container 61a is taken out of the second container 61b, and then it is placed in the heating unit 64 as a vacuum is maintained. Accordingly, an evaporation source can be prepared. The workpiece (substrate) 65 is placed so as to face to the first container 61a.

Subsequently, the heating unit 64 for resistance heating heats the evaporation materials, and the film 66 can be deposited over the surface of the workpiece 65 facing to the evaporation source. The deposited film 66 thus obtained does not contain impurities. When the deposited film 66 is used to complete a light emitting element, high reliability and high brightness can be realized.

In this manner, the first container 61a is placed in the process chamber 63 with never exposed to atmosphere, and evaporation can be conducted as the purity is kept at the level that the evaporation material 62 has been housed by the material manufacturer. The material manufacturer directly houses the EL material 62 in the first container 61a, which can provide just a necessary amount for the light emitting device manufacturer and allows efficient use of relatively expensive EL materials.

In the traditional evaporation methods based on resistance heating, the utilization ratio of materials is low. For example, the following is a method of enhancing the utilization ratio. A new EL material is housed in the crucible at the time of maintenance of the evaporation apparatus, a first time evaporation is conducted in this state, and then unevaporated residual materials remain. Then, in the next time deposition, an EL material is newly replenished on the residual materials for evaporation, and replenishing is repeated in the subsequent evaporation until maintenance. This method can enhance the utilization ratio, but the method can cause the residual materials to be contamination. An operator replenishes the materials, and thus there is the possibility that oxygen and moisture are mixed into the evaporation materials in replenishing to degrade the purity. The crucible is repeatedly used for evaporation for several times, and discarded at the time of maintenance. In order to prevent the contamination by impurities, it can be considered that a new EL material is housed in a crucible at every time of evaporation and the crucible is also discarded at every time of evaporation, but fabrication costs become high.

The fabrication system can eliminate the traditional glass bottles housing the evaporation materials and the operation to transfer the materials from the glass bottle to the crucible, which can prevent impurities from being mixed. In addition to this, throughput is improved as well.

According to the example, the fabrication system can be realized that allows full automation to enhance throughput, and a total closed system can be realized that allows preventing impurities from being mixed in the evaporation material 62 purified by the material manufacturer 68.

The EL materials are exemplified for description. However, in the example, the metal layers to be the cathode and the anode can be deposited by evaporation based on resistance heating as wells. When the cathode is formed by resistance heating, the EL element can be fabricated without varying the electric characteristics (on-state current, off-state current, Vth, and S-value) of the TFT 22.

As for the metal materials, it is acceptable that the metal materials are housed in the first container beforehand in the similar manner, the first container is placed in the evaporation apparatus as it is, and the materials are evaporated by resistance heating to deposit a film.

The example can be combined freely with any of the embodiment, and the examples 1 to 4.

Example 6

In this example, the form of the container for transport will be described in detail with FIG. 8A. The second container for transport has an upper part 721$a$ and a lower part 721$b$. The second container has a fixing unit 706 disposed in the upper part of the second container for fixing the first container, a spring 705 for applying pressure to the fixing unit, a gas inlet 708 disposed in the lower part of the second container, which is a gas line for reducing and keeping pressure in the second container, an O-ring for fixing the upper container 721$a$ to the lower container 721$b$, and a fastener 702. In the second container, the first container 701 sealed with the purified evaporation material is placed. It is fine that the second container is formed of a material containing stainless steel, and the first container 701 is formed of a material having titanium.

In the material manufacturer, the purified evaporation material is sealed in the first container 701. Then, the upper part 721$a$ of the second container is set on the lower part 721$b$ of the second container through the O-ring, the fastener 702 fixes the upper container 721$a$ to the lower container 721$b$, and then the first container 701 is sealed in the second container. After that, the inside of the second container is depressurized through the gas inlet 708 and substituted by a nitrogen atmosphere, and the spring 705 is controlled to fix the first container 701 by the fixing unit 706. It is fine to place a desiccant in the second container. In this manner, when the inside of the second container is kept in a vacuum, a reduced pressure, or a nitrogen atmosphere, even slight oxygen and moisture can be prevented from attaching to the evaporation materials.

In this state, the containers are transported to the light emitting device manufacturer, and the first container 701 is placed in the film-formation chamber. After that, the evaporation material is sublimated by heating to deposit a film.

Desirably, other components such as a film thickness monitor (quartz resonator) and a shutter are transported and placed in the evaporation apparatus without exposed to atmosphere in the similar manner.

In the example, the film-formation chamber is joined to a setting chamber in which a crucible (that is filled with the evaporation material), which has been vacuum-sealed in the container without being exposed to atmosphere, is taken out of the container to set the crucible in the evaporation source holder. The crucible is transferred from the setting chamber by a transport robot without being exposed to atmosphere. Preferably, the setting chamber is provided with a vacuuming unit and further with a heating unit for heating the crucible.

A mechanism of placing the first container 701 in the film-formation chamber will be described with FIGS. 8A and 8B, the first container is sealed in the second containers 721$a$ and 721$b$ for transport.

Figure 8A:
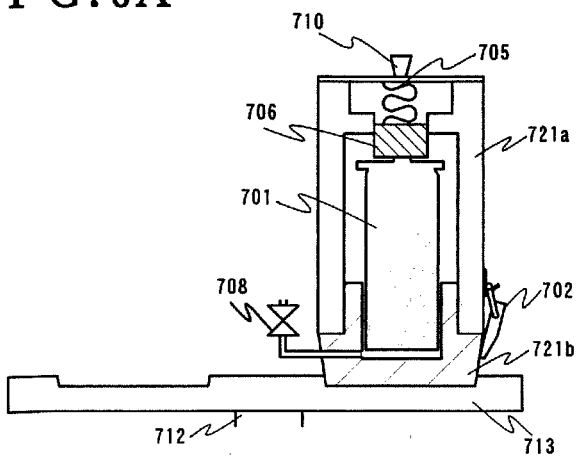
FIGS. 8A and 8B are diagrams illustrating crucible transport in a setting chamber.
Figure 8B:
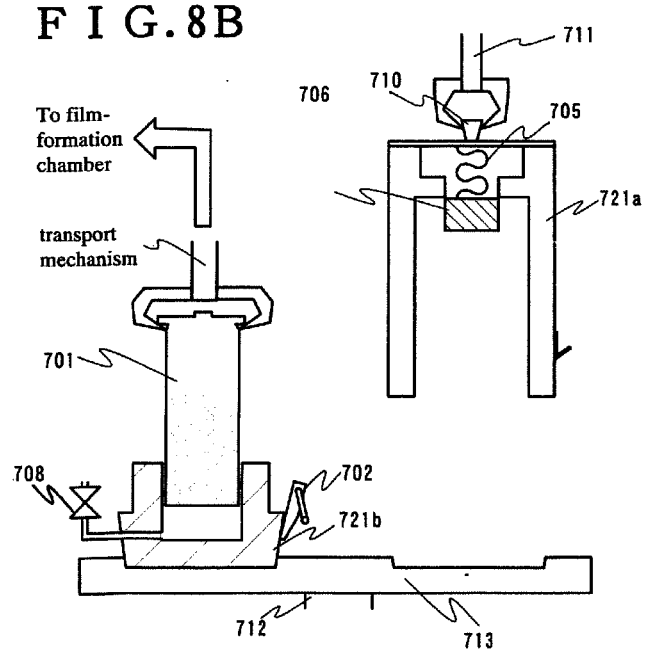

FIG. 8A illustrates a cross section of a setting chamber 713 having a rotating table 713 for holding the second containers 721$a$ and 721$b$ housing the first container, a transport mechanism for transport the first container, and a lift mechanism 711. The setting chamber is disposed adjacent to the film-formation chamber, and can control atmospheres in the setting chamber by an atmosphere control unit through the gas inlet. The transport mechanism of the example is not limited to the configuration in which the first container is clamped (picked) above the first container 701 for transport as shown in FIG. 8B. The configuration is acceptable that the first container is clamped from the side faces for transport.

In this setting chamber, the second container is placed on the rotating table 713 with the fastener 702 removed. The inside is in a vacuum state, and thus the second container is not off when the fastener 702 is removed. Then, the atmosphere control unit reduces the pressure in the setting chamber. When the pressure in the setting chamber becomes equal to the pressure in the second container, the second container is easily opened. The lift mechanism 711 removes the upper part 721$a$ of the second container, and the rotating table 713 rotates about a rotating shaft 712 as an axis, which moves the lower part of the second container and the first container. Then, the transport mechanism transfers the first container 701 to the film-formation chamber, and places the first container 701 in the evaporation source holder (not shown).

After that, a heating unit disposed in the evaporation source holder sublimates the evaporation material to start deposition. In this deposition, when the shutter (not shown) disposed in the evaporation source holder is opened, the sublimated evaporation material flies in the direction of the substrate to be deposited over the substrate, and a light emitting layer (including a hole transport layer, a hole injection layer, an electron transport layer and an electron injection layer) is deposited.

Subsequently, after completing evaporation, the first container is picked up from the evaporation source holder, transported to the setting chamber, placed on the lower container of the second container (not shown) set on the rotating table 713, and sealed with the upper container 721a. At this time, preferably, the first container, the upper container and the lower container are sealed in accordance with the transferred combinations. In this state, the setting chamber 805 is set at an atmospheric pressure. The second container is taken out of the setting chamber, fixed with the fastener 702, and transported to the material manufacturer.

Figure 9A:
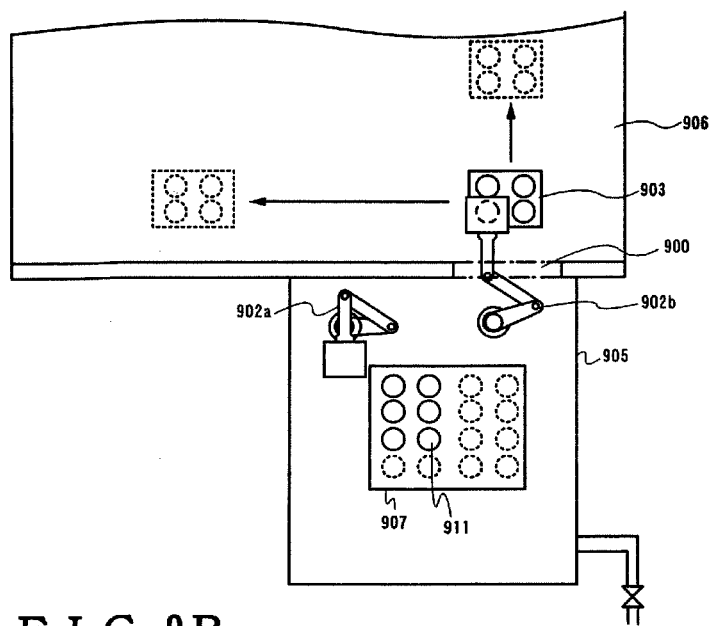
FIGS. 9A and 9B are diagrams illustrating the crucible transport to the evaporation source holder in the setting chamber.
Figure 9B:
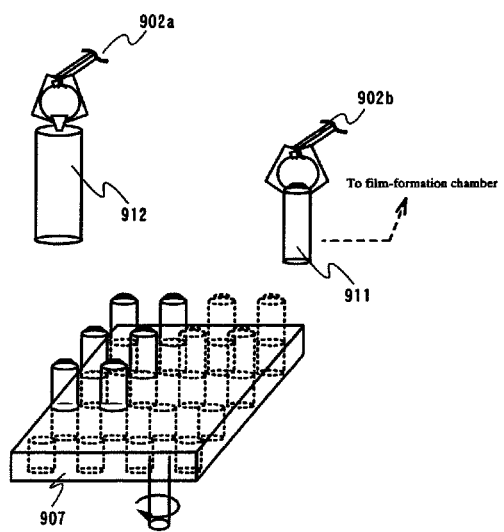

FIGS. 9A and 9B show an example of the setting chamber that can hold a plurality of first containers 911. In FIG. 9A, a setting chamber 905 has a rotating table 907 capable of holding a plurality of the first containers 911 or second containers 912, a transport mechanism 902b for transferring the first container, and a lift mechanism 902a. The film-formation chamber 906 has an evaporation source holder 903 and a holder moving mechanism (not shown here). FIG. 9A shows a top view, and FIG. 9B shows a perspective view inside the setting chamber. The setting chamber 905 is provided with a gate valve 900 adjacent to the film-formation chamber 906, and atmospheres of the setting chamber can be controlled by an atmosphere control unit through a gas inlet. Not shown in the drawing, the places to arrange the removed upper part (second container) 912 are disposed separately.

Alternatively, it is acceptable that a robot is equipped in the pretreatment chamber (setting chamber) joined to the film-formation chamber, moved from the film-formation chamber to the pretreatment chamber at every evaporation source, and allowed to set evaporation materials in the evaporation source in the pretreatment chamber. More specifically, a fabrication system is acceptable in which the evaporation source is moved to the pretreatment chamber. Accordingly, the evaporation source can be set with the cleanness of the film-formation chamber maintained.

The example can be combined freely with any one of the embodiment and the examples 1 to 5.

Example 7

Figure 10:
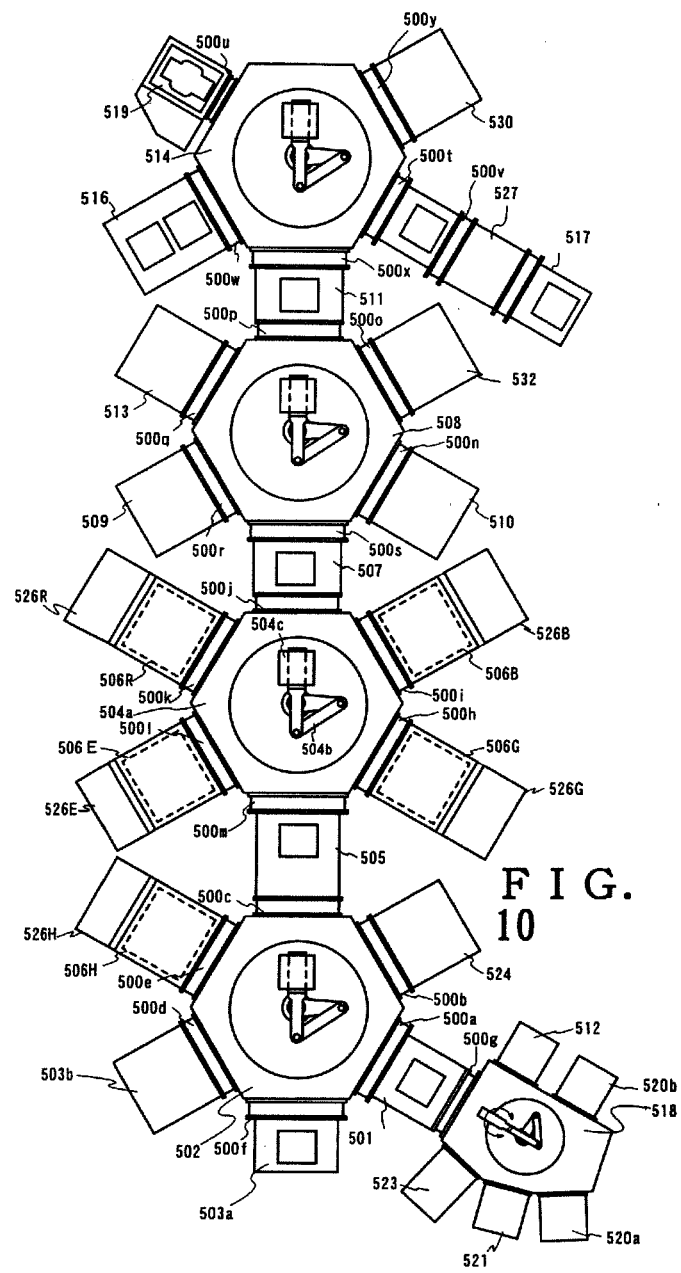
FIG. 10 is a diagram illustrating a fabrication system of a multi-chamber system (Example 7).

In this example, FIG. 10 shows an example of a fabrication system of a multi-chamber system with the fully automated process steps from first electrode formation to encapsulation.

FIG. 10 is a multi-chamber fabrication system having gates 500a to 500y, transport chambers 502, 504a, 508, 514 and 518, delivery chambers 505, 507 and 511, preparation chamber 501, a first film-formation chamber 506H, a second film-formation chamber 506B, a third film-formation chamber 506G, a fourth film-formation chamber 506R, a film-formation chamber 506E, other film-formation chambers 509, 510, 512, 513, 531 and 532, setting chambers 526R, 526G, 526B, 526E and 526H for setting evaporation sources, pretreatment chambers 503a and 503b, an encapsulation chamber 516, a mask stock chamber 524, an encapsulation substrate stock chamber 530, cassette chambers 520a and 520b, a tray mounting stage 521, and a take-out chamber 519. The transport chamber 504a is provided with a transport mechanism 504b for transferring a substrate 504c, and the other transport chambers are similarly provided with separate transport mechanisms as well.

Hereafter, the procedures are shown that a substrate formed with an anode (first electrode) and an insulator (barrier wall) for covering the end parts of the anode beforehand is carried in the fabrication system shown in FIG. 10 to fabricate a light emitting device. In the case of fabricating an active matrix light emitting device, the substrate is formed with a plurality of thin film transistors (current controlling TFTs) connected to the anode and other thin film transistors (such as switching TFTs) beforehand, and formed with a drive circuit formed of thin film transistors as well. Also in the case of fabricating a simple matrix light emitting device, it can be fabricated by the fabrication system shown in FIG. 10.

First, the substrate is set in the cassette chamber 520a or the cassette chamber 520b. When the substrate is a large-sized substrate (300 mm×360 mm, for example), it is set in the cassette chamber 520b. When the substrate is a general substrate (127 mm×127 mm, for example), it is set in the cassette chamber 520a, and transferred to the tray mounting stage 521. A plurality of the substrates is set on a tray (300 mm×360 mm, for example).

The substrate (the substrate formed with the anode and the insulator for covering the end parts of the anode) set in the cassette chamber is transferred to the transport chamber 518.

Before the substrate is set in the cassette chamber, the surface of the first electrode (anode) is preferably cleaned with a porous sponge immersed with a surface active agent (alkalescence) (typically, the sponge is made of PVA (polyvinyl alcohol) and nylon) to remove dust and dirt on the surface in order to reduce dot defects. As a cleaning mechanism, it is acceptable to use a cleaning apparatus having a rotating brush (made of PVA) that rotates about the axis in parallel to the substrate surface to contact the substrate surface, or a cleaning apparatus having a disc brush (made of PVA) that rotates about the axis orthogonal to the substrate surface to contact the substrate surface. Before a film containing organic compounds is deposited, the substrate is preferably annealed for deaeration in a vacuum in order to remove moisture and other gasses contained in the substrate. It is fine to transfer the substrate to a baking chamber 523 joined to the transport chamber 518 for annealing.

Subsequently, the substrate is transferred from the transport chamber 518 provided with a substrate transport mechanism to the preparation chamber 501. In the fabrication system of the example, a robot equipped in the transport chamber 518 can reverse the substrate, which can transfer the substrate in reverse to the preparation chamber 501. In the example, the transport chamber 518 is always kept at an atmospheric pressure. The preparation chamber 501 is joined to a vacuum processing chamber, which is preferably vacuumed, introduced with an inert gas, and kept at an atmospheric pressure.

Subsequently, the substrate is transferred to the transport chamber 502 joined to the preparation chamber 501. The transport chamber 502 is preferably vacuumed to keep in a vacuum beforehand so as not to exist moisture and oxygen as little as possible.

As the vacuum processing chamber, a magnetic levitated turbo-molecular pump, a cryopump or a dry-sealed vacuum pump is provided. Accordingly, the ultimate vacuum in the transport chamber joined to the preparation chamber can be set at $10^{-5}$ to $10^{-6}$ Pa, and the back diffusion of impurities from the pump side and an exhaust system can be controlled. In order to prevent impurities from being mixed in the apparatus, an inert gas such as nitrogen and a rare gas is used for the gas to be introduced. The gases to be introduced into the apparatus are highly purified by a gas purifier before introduced into the apparatus. Therefore, the gas purifier needs to be provided so that gases are highly purified and then introduced into the evaporation apparatus. Accordingly, oxygen, moisture and other impurities contained in the gases can be removed beforehand. Thus, these impurities can be prevented from being introduced into the apparatus.

In the case of removing a film containing organic compounds having been deposited in an unnecessary place, it is fine that the substrate is transferred to the pretreatment chamber 503a to selectively remove a multilayer of organic compound films. The pretreatment chamber 503a has a plasma generating unit that excites one kind or a plurality of kinds of gases selected from Ar, H, F and O to generate plasma for dry etching. A mask is used to selectively remove only an unnecessary portion. It is acceptable to provide an ultraviolet ray irradiation mechanism in the pretreatment chamber 503a in order to irradiate ultraviolet rays as anode surface processing.

In order to eliminate shrinks, the substrate is preferably heated under vacuum right before the film containing organic compounds is deposited. In order to thoroughly remove moisture and other gases contained in the substrate in the pretreatment chamber 503b, the substrate is annealed for deaeration in a vacuum ($5\times10^{-3}$ Torrs (0.665 Pa) or below, preferably $10^{-4}$ to $10^{-6}$ Pa). In the pretreatment chamber 503b, a flat heater (typically, it is a sheath heater) is used to heat a plurality of substrates uniformly. A plurality of the flat heaters can be disposed to heat the substrate from both sides as sandwiched by the flat heaters. Of course, the flat heater can heat the substrate from one side. Particularly, when an organic resin film is used as a material for an interlayer dielectric or a barrier wall, some organic resin materials tend to absorb moisture to likely to cause further deaeration. Thus, it is effective to perform heating under vacuum in which the substrate is annealed at temperatures of 100 to 250° C., preferably 150 to 200° C. for 30 minutes or more, and then naturally cooled for 30 minutes, for example, to remove absorbed moisture before the layer containing organic compounds is deposited.

Then, after heating under vacuum, the substrate is transferred from the transport chamber 502 to the delivery chamber 505, and the substrate is further transferred from the delivery chamber 505 to the transport chamber 504a without being exposed to atmosphere.

Subsequently, the substrate is properly transferred to the film-formation chambers 506R, 506G, 506B and 506E joined to the transport chamber 504a to appropriately deposit thereon an organic compound layer made of low weight molecules to be a hole injection layer, a hole transport layer, a light emitting layer, an electron transport layer, or an electron injection layer. Alternatively, the substrate can be transferred from the transport chamber 102 to the film-formation chamber 506H for evaporation.

Alternatively, it is acceptable that a hole injection layer made of polymer material is deposited in the film-formation chamber 512 under atmospheric pressure or reduced pressure by inkjet deposition or spin coating. Also, it is fine that the substrate is placed vertically for deposition in a vacuum by ink-jet deposition. It is acceptable to coat poly(styrenesulfonate)/poly(ethylenedioxythiophene) (PEDOT/PSS) aqueous solution, polyaniline/camphor sulfonic acid aqueous solution (PANI/CSA), PTPDES, Et-PTPDEK, or PPBA, which function as a hole injection layer (anode buffer layer), over throughout the surface of the first electrode (anode) for baking. In baking, the substrate is baked in the baking chamber 523. When the hole injection layer made of a polymer material is deposited by a coating method using spin coating, the flatness is enhanced and the coverage and film thickness uniformity of the deposited film thereon can be excellent. Particularly, the film thickness of the light emitting layer becomes uniform, and thus uniform light emission can be obtained. In this case, preferably, the hole injection layer is deposited by the coating method, and then the substrate is heated under vacuum (100 to 200° C.) right before deposition by the evaporation method. It is fine that the substrate is heated under vacuum in the pretreatment chamber 503b. For example, the surface of the first electrode (anode) is cleaned with sponge, and the substrate is transferred to the cassette chamber and the film-formation chamber 512 to coat poly(styrenesulfonate)/poly(ethylenedioxythiophene) (PEDOT/PSS) aqueous solution over throughout the surface in a film thickness 60 nm by spin coating. Then, the substrate is transferred to the baking chamber 523 for pre-baking at a temperature of 80° C. for ten minutes, and for baking at a temperature of 200° C. for one hour. The substrate is further transferred to the pretreatment chamber 503b to be heated under vacuum (at a temperature of 170° C. for 30 minutes in heating, and for 30 minutes in cooling) right before evaporation. Then, the substrate is transferred to the film-formation chambers 506R, 506G and 506B for depositing the light emitting layer by the evaporation method without being exposed to atmosphere. Particularly, when an ITO film is used as an anode material and dips and bumps or fine particles exist on the surface, the film thickness of PEDOT/PSS is formed to be 30 nm or greater. Consequently, the influences can be reduced.

PEDOT/PSS does not have a good wetting property when it is coated over the ITO film. Therefore, preferably, the PEDOT/PSS solution is coated by spin coating for a first time, the surface is washed with pure water to enhance the wetting property, the PEDOT/PSS solution is again coated by spin coating for a second time, and the substrate is baked for deposition excellent in uniformity. After first time coating, the surface is washed with pure water to improve the surface, which can obtain an advantage to remove fine particles as well.

When PEDOT/PSS is deposited by spin coating, it is deposited over throughout the surface. Therefore, it is preferably removed selectively in the end faces, the rim part and the terminal part of the substrate and the connection areas of the cathode to lower wiring lines. Preferably, it is selectively removed in the pretreatment chamber 503a with a mask by $O_2$ ashing.

Here, the film-formation chambers 506R, 506G, 506B, 506E and 506H will be described.

Each of the film-formation chambers 506R, 506G, 506B, 506E and 506H is equipped with movable evaporation source holders. A plurality of the evaporation source holders is prepared to have a plurality of containers (crucibles) appropriately sealed with EL materials, and the holders are placed in the film-formation chamber in this state. In the film-formation chambers, the substrate is set in face down, and a CCD is used to align the position of the mask for evaporation by resistance heating, which allows selective deposition. The mask is stored in the mask stock chamber 524, and is properly transferred to the film-formation chamber in evaporation. The mask stock chamber is empty in evaporation, and thus the substrate after deposited or processed can be stored. The film-formation chamber 532 is a spare film-formation chamber for forming a layer containing organic compounds or a metal material layer.

Preferably, a fabrication system shown below is used to place EL materials in the film-formation chambers. More specifically, a container (typically, a crucible) in which an EL material is housed by a material manufacturer beforehand is preferably used for deposition. More preferably, the crucible is placed without being exposed to atmosphere. Preferably, the crucible is brought into the film-formation chamber as it is sealed in the second container when transported from the material manufacturer. Desirably, the setting chambers 526R, 526G, 526B, 526H and 526E are set in a vacuum or an inert gas atmosphere, the crucible is taken out of the second container in the setting chamber, and the crucible is placed in the film-formation chamber. The setting chambers have a vacuuming unit, which are joined to the film-formation chambers 506R, 506G, 506B, 506H and 506E, respectively. FIGS. 8A and 8B, or FIGS. 9A and 9B show one example of the setting chamber. Accordingly, the crucible and the EL material housed in the crucible can be prevented from contamination. In the setting chambers 526R, 526G, 526B, 526H and 526E, metal masks can be stored.

The EL materials placed in the film-formation chambers 506R, 506G, 506B, 506H and 506E are properly selected, and thus a light emitting element showing light emission in monochrome (specifically, white color) or full color (specifically, red green and blue) by the whole light emitting elements can be fabricated. For example, when a green light emitting element is fabricated, a hole transport layer or a hole injection layer is layered in the film-formation chamber 506H, a light emitting layer (G) is layered in the film-formation chamber 506G, an electron transport layer or an electron injection layer is layered in the film-formation chamber 506E, and then a cathode is formed. Consequently, the green light emitting element can be obtained. For example, when a full color light emitting element is fabricated, a mask for red color is used in the film-formation chamber 506R to sequentially layer a hole transport layer or a hole injection layer, a light emitting layer (R), and an electron transport layer or an electron injection layer. A mask for green color is used in the film-formation chamber 506G to sequentially layer a hole transport layer or a hole injection layer, a light emitting layer (G), and an electron transport layer or an electron injection layer. A mask for blue color is used in the film-formation chamber 506B to sequentially layer a hole transport layer or a hole injection layer, a light emitting layer (B), and an electron transport layer or an electron injection layer, and then a cathode is formed. Consequently, the full color light emitting element can be obtained.

The organic compound layer showing light emission in white color is mainly classified into a three band type having three primary colors, red, green and blue, and a two band type using the relationship of complementary colors, blue/yellow or cyan/orange in the case of layering light emitting layers having different emission colors. It is possible to fabricate the white light emitting element in a single film-formation chamber. For example, when the three band type is used to obtain the white light emitting element, film-formation chambers provided with a plurality of evaporation source holders mounted with a plurality of crucibles are prepared. Aromatic diamine (TPD) is sealed in a first evaporation source holder, p-EtTAZ is sealed in a second evaporation source holder, $Alq_3$ is sealed in a third evaporation source holder, an EL material of $Alq_3$ added with Nile Red constituting red light emission dye is sealed in a fourth evaporation source holder, and $Alq_3$ is sealed in a fifth evaporation source holder. In this state, the holders are placed in the separate film-formation chambers. Then, the first to fifth evaporation source holders sequentially start to move, and the substrate undergoes evaporation for layering. More specifically, TPD is sublimed from the first evaporation source holder by heating and deposited over throughout the substrate surface. Then, p-EtTAZ is sublimated from the second evaporation source holder, $Alq_3$ is sublimated from the third evaporation source holder, $Alq_3$:Nile Red is sublimated from the fourth evaporation source holder, $Alq_3$ is sublimated from the fifth evaporation source holder, and they are deposited over throughout the substrate surface. After that, a cathode is formed, and then the white light emitting element can be obtained.

According to the process steps, the layers containing organic compounds are properly layered, and then the substrate is transferred from the transport chamber 504a to the delivery chamber 507. The substrate is further transferred from the delivery chamber 507 to the transport chamber 508 without being exposed to atmosphere.

Subsequently, a transport mechanism equipped in the transport chamber 508 transfers the substrate to the film-formation chamber 510, and a cathode is formed. The cathode is an inorganic film formed by the evaporation method using resistance heating (a film formed by coevaporation of aluminum and an alloy such as MgAg, MgIn, $CaF_2$, LiF and CaN or an element in the Group 1 or the Group 2 of the periodic table, or a multilayer film of these). Alternatively, it is acceptable to form the cathode by sputtering.

When a top emission light emitting device is fabricated, the cathode is preferably transparent or semitransparent. Preferably, a thin film made of the metal films (1 to 10 nm), or a multilayer of the thin film made of the metal films (1 to 10 nm) and a transparent conductive film is formed to be the cathode. In this case, it is fine to deposit a transparent conductive film (ITO (indium tin oxide alloy), indium oxide-zinc oxide alloy ($In_2O_3$—ZnO), and zinc oxide (ZnO)) in the film-formation chamber 509 by sputtering.

According to the process steps, the light emitting element of the multilayer structure is fabricated.

It is acceptable that the substrate is transferred to the film-formation chamber 513 joined to the transport chamber 508 and a protection film formed of a silicon nitride film or a silicon nitride oxide film is formed for encapsulation. Here, inside the film-formation chamber 513, a target made of silicon, a target made of silicon oxide, or a target made of silicon nitride is provided. For example, the target made of silicon is used, and the atmosphere in the film-formation chamber is set in a nitrogen atmosphere or an atmosphere containing nitrogen and argon. Thus, a silicon nitride film can be deposited over the cathode. Alternatively, it is fine to deposit a thin film having a main component of carbon (a DLC film, a CN film, and an amorphous carbon film) as the protection film. It is also acceptable to separately provide a film-formation chamber by CVD. The diamond like carbon film (it is also called a DLC film) can be deposited by plasma CVD (typically, RF plasma CVD, microwave CVD, electron cyclotron resonance (ECR) CVD, and hot-filament CVD), flame combustion techniques, sputtering, ion beam evaporation, and laser evaporation. For reaction gases used for deposition, hydrogen gas and hydrocarbon based gas ($CH_4$, $C_2H_2$ and $C_6H_6$, for example) are used, they are ionized by glow discharge, and ions are accelerated and collided to the cathode negatively self biased for deposition. For the CN film, it is fine to use $C_2H_4$ gas and $N_2$ gas as reaction gases for deposition. The DLC film and the CN film are insulating films transparent or semitransparent to visible lights. Being transparent to visible lights is that the transmittance of visible lights ranges from 80 to 100%, and being semitransparent to visible lights is that the transmittance of visible lights ranges from 50 to 80%.

In the example, a protection layer formed of a multilayer of a first inorganic insulating film, a stress relaxation film, and a second inorganic insulating film is formed over the cathode. For example, after the cathode is formed, the substrate is transferred to the film-formation chamber 513 to deposit the first inorganic insulating film, and the substrate is transferred to the film-formation chamber 532 to deposit the stress relaxation film (a layer containing organic compounds) having water absorption and transparency by the evaporation method. The substrate is again transferred to the film-formation chamber 513 to deposit the second inorganic insulating film.

Subsequently, the substrate formed with the light emitting element is transferred from the transport chamber 508 to the delivery chamber 511, and from the delivery chamber 511 to the transport chamber 514 without being exposed to atmosphere. Then, the substrate formed with the light emitting element is transferred from the transport chamber 514 to the encapsulation chamber 516.

An encapsulation substrate is set in the loading chamber 517 from outside for preparation. In order to remove impurities such as moisture, the substrate is preferably annealed in a vacuum beforehand. Then, when a sealing material for bonding the substrate formed with the light emitting element is formed on the encapsulation substrate, the sealing material is formed in the sealing chamber 527, and the encapsulation substrate formed with the sealing material is transferred to the encapsulation substrate stock chamber 530. It is acceptable that a desiccant is disposed in the encapsulation substrate in the sealing chamber 527. Here, the example of forming the sealing material on the encapsulation substrate was shown, which is not defined particularly. It is acceptable to form the sealing material on the substrate formed with the light emitting element.

After that, the substrate is bonded to the encapsulation substrate in the encapsulation chamber 516, and ultraviolet rays are irradiated onto a set of the bonded substrates by an ultraviolet ray irradiation mechanism equipped in the encapsulation chamber 516 to cure the sealing material. Here, a UV curable resin is used as the sealing material, which is not limited particularly as long as it is an adhesive.

Subsequently, the set of the bonded substrates is transferred from the encapsulation chamber 516 to the transport chamber 514, and from the transport chamber 514 to the take-out chamber 519, and it is taken out.

As described above, the use of the fabrication system shown in FIG. 10 completely avoids the light emitting element from being exposed to atmosphere until it is sealed in a closed space. Therefore, a highly reliable light emitting device can be fabricated. In the transport chamber 514, the substrate is transferred under atmospheric pressure, but a vacuum and a nitrogen atmosphere at an atmospheric pressure can be repeated for removing moisture. However, the transport chambers 502, 504a and 508 are desirably kept in a vacuum all the time. The transport chamber 518 is always at an atmospheric pressure.

Not shown in the drawing here, a control system for controlling operations in the separate processing chambers, a control system for transporting the substrate among the separate processing chambers, and a control system for controlling routes to transfer the substrate to the separate processing chambers for automation are equipped.

Alternatively, in the fabrication system shown in FIG. 10, a top emission (or top and bottom emission) light emitting element can be fabricated in which a substrate formed with a transparent conductive film (or a metal film (TiN)) to be an anode is brought in, a layer containing organic compounds is deposited, and a transparent or semitransparent cathode (for example, a multilayer of a thin metal film (Al, Ag) and a transparent conductive film) is deposited. The top emission light emitting element is the element that passes light through the cathode and emits light generated in the organic compound layer.

Alternatively, in the fabrication system shown in FIG. 10, a bottom emission light emitting element can be fabricated in which a substrate formed with a transparent conductive film to be an anode is brought in, a layer containing organic compounds is deposited, and a cathode formed of a metal film (Al, Ag) is deposited. The bottom emission light emitting element is the element that emits light generated in the organic compound layer from the anode being a transparent electrode toward the TFT and passes the light through the substrate.

The example can be combined freely with the embodiment, the example 1, 2, 3, 5, or 6.

The deposition apparatus of the invention is used for evaporation, which can significantly improve the film thickness uniformity, the utilization efficiency for evaporation materials, and throughput.

What is claimed is:

1. A fabrication method of a light emitting device, comprising:
   placing a substrate in a film-formation chamber, over a first crucible;
   evaporating a material from an evaporation source comprising the first crucible in the film-formation chamber, an opening of the first crucible facing the substrate;
   depositing a layer comprising the material over the substrate in the film-formation chamber by line-of-sight transfer from the opening of the first crucible to the substrate and through a mask interposed between the substrate and the first crucible; and
   cleaning the mask inside of the film-formation chamber after completion of the deposition, by using a plasma generating unit provided in the film-formation chamber,
   wherein during evaporation the substrate is rotated around a vertical axis while the first crucible is moved in a horizontal direction.

2. The fabrication method of the light emitting device according to claim 1, wherein the substrate is fixed using a magnet.

3. The fabrication method of the light emitting device according to claim 1, wherein the evaporation source is moved in a direction parallel to a surface of the substrate while the layer is being deposited.

4. The fabrication method of the light emitting device according to claim 1, wherein the evaporation source is moved in a zigzag manner.

5. The fabrication method of the light emitting device according to claim 1, wherein the evaporation source comprising the first crucible is filled with a first EL material and is further provided with a second crucible filled with a second EL material, and
   wherein the first crucible and the second crucible are slanted in the evaporation source so that a deposition direction of the first EL material crosses a deposition direction of the second EL material at a position of the substrate.

6. The fabrication method of the light emitting device according to claim 1, wherein the material is an EL material.

7. The fabrication method of the light emitting device according to claim 1, wherein a distance between the evaporation source and the substrate is 30 cm or below.

8. The fabrication method of the light emitting device according to claim 1, wherein a distance between the evaporation source and the substrate is 5 to 15 cm.

9. A fabrication method of a light emitting device, comprising:

providing a first crucible vacuum-sealed in a container, the container being placed in a setting chamber adjacent to a film-formation chamber;

transferring the first crucible from the setting chamber to the film-formation chamber without exposing the first crucible to an atmosphere;

placing a substrate in the film-formation chamber, over a first crucible;

evaporating a material from an evaporation source comprising the first crucible in the film-formation chamber, an opening of the first crucible facing the substrate; and depositing a layer comprising the material over the substrate in the film-formation chamber by line-of-sight transfer from the opening of the first crucible to the substrate, wherein during evaporation the substrate is rotated around a vertical axis while the first crucible is moved in a horizontal direction.

10. The fabrication method of the light emitting device according to claim 9, wherein the substrate is fixed using a magnet.

11. The fabrication method of the light emitting device according to claim 9, wherein the evaporation source is moved in a zigzag manner.

12. The fabrication method of the light emitting device according to claim 9, wherein the evaporation source comprising the first crucible is filled with a first EL material and is further provided with a second crucible filled with a second EL material, and wherein the first crucible and the second crucible are slanted in the evaporation source so that a deposition direction of the first EL material crosses a deposition direction of the second EL material at a position of the substrate.

13. The fabrication method of the light emitting device according to claim 9, wherein the material is an EL material.

14. The fabrication method of the light emitting device according to claim 9, wherein a distance between the evaporation source and the substrate is 30 cm or below.

15. The fabrication method of the light emitting device according to claim 9, wherein a distance between the evaporation source and the substrate is 5 to 15 cm.

16. A fabrication method of a light emitting device, comprising:

placing a substrate in a film-formation chamber, over a first crucible;

evaporating a material from an evaporation source comprising the first crucible in the film-formation chamber, an opening of the first crucible facing the substrate; and depositing a layer comprising the material over the substrate in the film-formation chamber by line-of-sight transfer from the opening of the first crucible to the substrate, wherein during evaporation the substrate is rotated around a vertical axis while the first crucible is moved in a horizontal direction, wherein a distance between the evaporation source and the substrate is 30 cm or below, and wherein the substrate is a large-sized substrate of 300 mm×360 mm.

17. The fabrication method of the light emitting device according to claim 16, wherein the substrate is fixed using a magnet.

18. The fabrication method of the light emitting device according to claim 16, wherein the evaporation source comprising the first crucible is filled with a first EL material and is further provided with a second crucible filled with a second EL material, and wherein the first crucible and the second crucible are slanted in the evaporation source so that a deposition direction of the first EL material crosses a deposition direction of the second EL material at a position of the substrate.

19. The fabrication method of the light emitting device according to claim 16, wherein the material is an EL material.

20. The fabrication method of the light emitting device according to claim 16, wherein the distance between the evaporation source and the substrate is 5 to 15 cm.

* * * * *